United States Patent
Zorian et al.

(10) Patent No.: US 7,127,647 B1
(45) Date of Patent: Oct. 24, 2006

(54) APPARATUS, METHOD, AND SYSTEM TO ALLOCATE REDUNDANT COMPONENTS

(75) Inventors: Yervant Zorian, Santa Clara, CA (US); Gevorg Torjyan, Yerevan (AM)

(73) Assignee: Virage Logic Corporation, Fremont, CA (US)

( * ) Notice: Subject to any disclaimer, the term of this patent is extended or adjusted under 35 U.S.C. 154(b) by 388 days.

(21) Appl. No.: 09/962,761

(22) Filed: Sep. 24, 2001

Related U.S. Application Data

(60) Provisional application No. 60/301,901, filed on Jun. 29, 2001.

(51) Int. Cl.
G11C 29/00 (2006.01)

(52) U.S. Cl. ..................................................... 714/711

(58) Field of Classification Search .................. 714/7, 714/8, 42, 710, 711, 718, 719, 723; 365/200, 365/201
See application file for complete search history.

(56) References Cited

U.S. PATENT DOCUMENTS

| | | | |
|---|---|---|---|
| 5,513,318 A | 4/1996 | van de Goor et al. | |
| 5,583,463 A | 12/1996 | Merritt | |
| 5,608,678 A | 3/1997 | Lysinger | |
| 5,960,009 A | 9/1999 | Gizopoulos et al. | |
| 5,978,935 A | 11/1999 | Kim et al. | |
| 5,978,947 A | 11/1999 | Kim et al. | |
| 6,067,262 A * | 5/2000 | Irrinki et al. | 365/201 |
| 6,181,614 B1 * | 1/2001 | Aipperspach et al. | 365/200 |
| 6,255,836 B1 | 7/2001 | Schwarz et al. | |
| 6,304,989 B1 * | 10/2001 | Kraus et al. | 714/733 |
| 6,330,696 B1 | 12/2001 | Zorian et al. | |
| 6,396,760 B1 | 5/2002 | Behera et al. | |
| 6,397,349 B1 * | 5/2002 | Higgins et al. | 714/7 |
| 6,408,401 B1 * | 6/2002 | Bhavsar et al. | 714/7 |
| 6,496,946 B1 | 12/2002 | Bannatyne et al. | |
| 6,510,398 B1 | 1/2003 | Kundu et al. | |
| 6,519,202 B1 | 2/2003 | Shubat et al. | |
| 6,574,757 B1 | 6/2003 | Park et al. | |
| 6,651,202 B1 | 11/2003 | Phan | |
| 6,691,252 B1 | 2/2004 | Hughes et al. | |
| 6,766,468 B1 | 7/2004 | Barth et al. | |
| 6,795,942 B1 | 9/2004 | Schwarz | |

OTHER PUBLICATIONS

Su, Chauchin, et. al., "A Computer Aided Engineering System for Memory BIST," pp. 1-4, DAC, 2001.
Zorian, Yervant, "Embedding Infrastructure IP for SOC Yield Improvement," Jun. 2002, 709-712, DAC.
Parvathala, Praveen, et. al., "FRITS—A Microprocessor Functional BIST Method," Mar. 2002, pp. 590-598, ITC.
Change, Tsin-Yuan and Zorian, Yervant: "Tutorial 2: SoC Testing and P1500 Standard," Asian Test Symposium 2000: 492.

(Continued)

*Primary Examiner*—Guy Lamarre
*Assistant Examiner*—John J. Tabone, Jr.
(74) *Attorney, Agent, or Firm*—Blakely, Sokoloff, Taylor & Zafman LLP

(57) ABSTRACT

In general, a method, apparatus, and system determine the allocation of the one or more redundant components while fault testing the memory. In an embodiment of an apparatus, one or more memories and one or more processors are located on a single chip. Each memory has one or more redundant components associated with that memory. The one or more redundant components include at least one redundant column. The one or more processors contain redundancy allocation logic having an algorithm. The algorithm determines the allocation of the one or more redundant components to repair one or more defects detected in the one or more memories while fault testing the memory.

35 Claims, 30 Drawing Sheets

OTHER PUBLICATIONS

Marinissen, Erik Jan, et. al.: "Wrapper Design for Embedded Core Test," ITC 2000: 911-920.

Zorian, Yervant and Shoukourian, Samvel: "Embedded-Memory Test and Repair: Infrastructure IP for SoC Yield," IEEE CS and IEEE CASS May-Jun. 2003: 58-66.

Benso, Alfredo, et. al.: "HD2BIST: a Hierarchical Framework for BIST Scheduling, Data Patterns Delivering and Diagnosis in SoCs," ITC 2000: 892-901.

Gizopoulos, Dimitris, et. al.: "Low Power/Energy BIST Scheme for Datapaths," VTS 2000: 23-28.

Vardanian, Valery A. and Zorian, Yervant: "A March-based Fault Location Algorithm for Static Random Access Memories," MDTD 2002: 256-261.

Benso, Alfredo, et. al., "HD-BIST: A Hierarchical Framework for BIST Scheduling and Diagnosis in SoCs," ITC 1999: 1038-1044.

Yervant Zorian: "System-Chip Test Strategies" (Tutorial): DAC 1998: 752-757.

Ilyoung Kim, Yervant Zorian, Goh Komoriya, Hai Pham, Frank P. Higgins, Jim L. Lewandowski: "Built-in Self-Repair for Embedded High Density SRAM." ITC 1998: 1112-1119.

Yervant Zorian, Erik Jan Marinissen, Sujit Dey: "Testing Embedded-Core Based System Chips." ITC 1998: pp. 1-14.

Yervant Zorian, Erik Jan Marinissen, "System Chip Test: How Will It Impact Your Design?" pp. 1-6, DAC, 2000.

Monica Lobetti Bodoni, Alfredo Benso, Silvia Chiusano, Stefano DiCarlo, Giorgio DiNatale, Paolo Prinetto, "An Effective Distributed BIST Architecture for RAMs," pp. 1-6, IEEE European Test Workshop, 2000.

S. Shoukourian, V. Vardanian, Y. Zorian, "An Approach for Evaluation of Redundancy Analysis Algorithms", The Proceedings of IEEE Int. Workshop on Memory Technology, Design and Testing, 2001.

D. K. Bhavsar, "An Algorithm for Row-Column Self-Repair of RAMs and its Implementation in the Alpha 21264", Proc. ITC'1999, pp. 311-318.

T. Kawagoe, J. Ohtani, M. Niiro et al, "A Built-In Self-Repair Analyzer (CRESTA) for embedded DRAMs", Proc. ITC'2000, pp. 567-574.

* cited by examiner

Four Passes Algorithm in Order to Improve Results in the Case of Single Faults in the Row.

The occurred faults are already registered

Figure 15 Multiple errors in Row fix with Row2

APPARATUS, METHOD, AND SYSTEM TO ALLOCATE REDUNDANT COMPONENTS

RELATED APPLICATIONS

This application is a continuation in part of provisional U.S. patent application Ser. No. 60/301,901, filed on Jun. 29, 2001.

FIELD OF THE INVENTION

The present invention relates generally to integrated circuits consisting of stand-alone memory devices or embedded memories, and more specifically to a memory having a column and/or row redundancy scheme.

BACKGROUND OF THE INVENTION

Random defects occurring during the manufacturing of an integrated circuit with embedded memory blocks can render certain non-redundant elements of an integrated circuit memory device, such as a memory column, defective. For example, particle contamination during the manufacturing process may cause broken or shorted out columns and bit defects.

Redundant elements in an integrated circuit memory device, such as redundant columns, are used to compensate for these random defects. Initial testing of an integrated circuit memory occurs after the manufacturing process. During initial testing of an integrated circuit memory device, defective elements are replaced by non-defective elements referred to as redundant elements. Thus, redundant columns may be used in a scheme to replace defective non-redundant columns, discovered during initial testing of the integrated circuit memory device. The use of redundant elements is important in increasing the overall yield of an integrated circuit memory device.

FIG. 1 illustrates a block diagram of a current external test solution to test an embedded memory possessing a redundancy structure used in a system on a chip (SoC). As more memory is used on a SoC 102, the yield of the memories decreases. SoC 102 integrate on-chip memory 104 with processors and other similar components all on the same chip to decrease cost and increase performance. Redundancy techniques include adding extra memory rows and memory columns that can be substituted for defective elements. The current external test solution 106 necessitates a costly investment in external test equipment to find and fix defects. The current external test may cost companies millions of dollars. Also, four equipment insertions may be required when testing SoC memory 104. First, the external memory tester 108 tests the memory to find defective components on the SoC 102 die. The external memory tester 108 imports the failure results in order to perform redundancy analysis and allocation. The external memory tester 108 sends the repair signature, or in other words the information on how to allocate the repair elements for any defects, to the laser repair equipment 110. Second, the laser repair equipment 110 blows the fuses on the SoC 102 wafer that enable the redundant rows and memory columns to be substituted for the defective memory cells. Third, the memory tester 108 re-tests memory on the SoC 102 to ensure that the repairs were made properly. Last, the logic tester 112 analyzes the remaining non-memory components of the SoC 102.

The required external test solution 106 is expensive, time-consuming, may not achieve a dramatic increase in yield, and in the future it may not be a feasible solution for SoC testing. The memory tester 108 assumes that the memories 104 used in a SoC 102 are readily accessible directly from the I/O pins of the chip. A designer must carefully route each embedded memory 104 to enable pin access. As more embedded memories 104 are physically located onto a chip containing the entire system, more design time is required to route the embedded memories 104 and establish the pin connections. Meanwhile, the die size may increase from the extra routing, and chip packages may enlarge accordingly. The physical size and spacing requirements of SoC 102 dies may not accommodate the extra space need to test the memories. Also, memory tester 108 may not be able to test the memories at the speed of the chip.

SUMMARY OF THE INVENTION

A method, apparatus, and system that determine the allocation of the one or more redundant components while fault testing the memory. In an embodiment of an apparatus, one or more memories and one or more processors are located on a single chip. Each memory has one or more redundant components associated with that memory. The one or more redundant components include at least one redundant column. The one or more processors contain redundancy allocation logic having an algorithm. The algorithm determines the allocation of the one or more redundant components to repair one or more defects detected in the one or more memories while fault testing the memory.

BRIEF DESCRIPTION OF THE DRAWINGS

The drawings refer to the invention in which.

Figure 1:
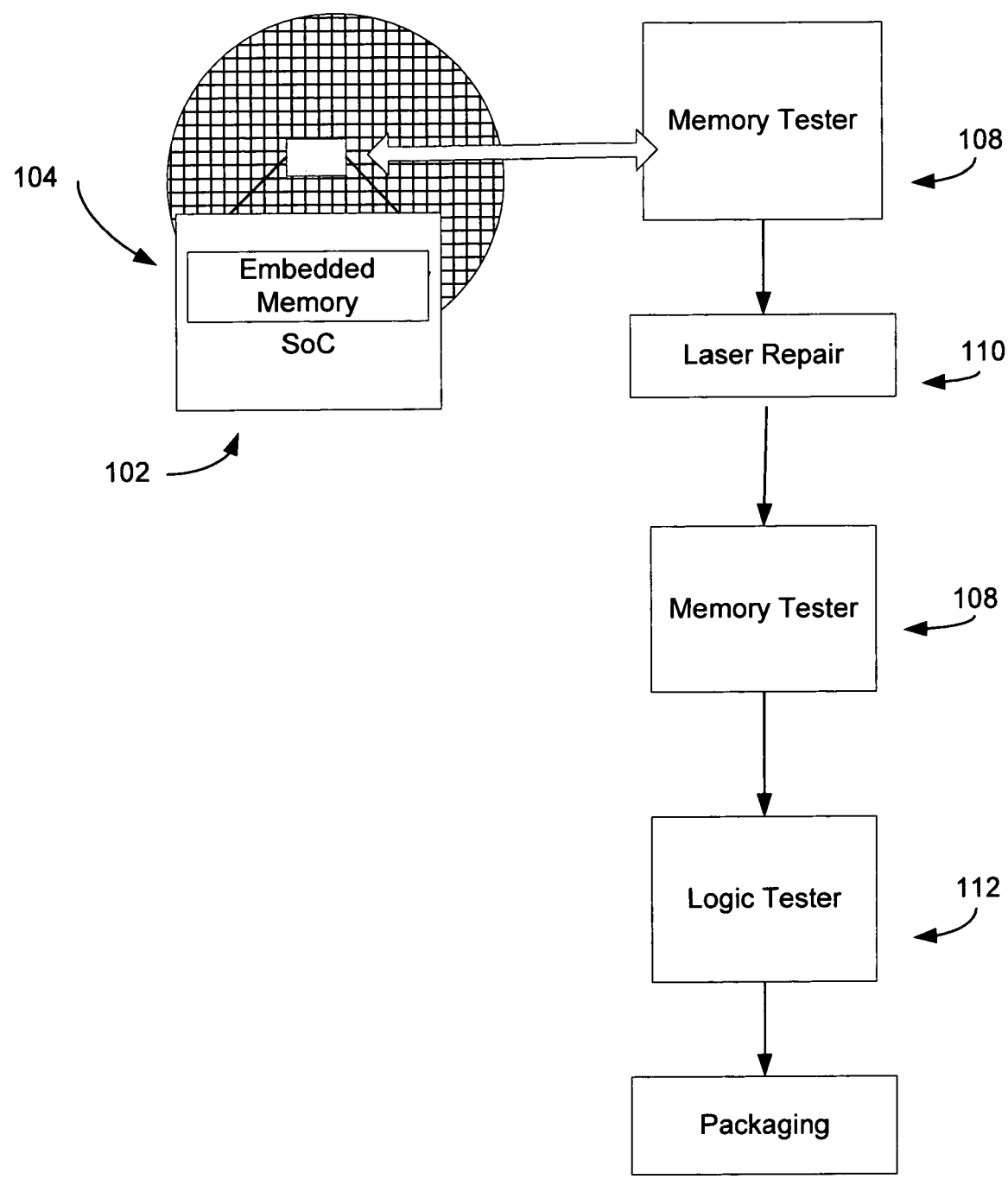
FIG. 1 illustrates a block diagram of a current external test solution to test an embedded memory possessing a redundancy structure used in a system on a chip (SoC)

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, sequence of specific registers changing status, etc., in order to provide a thorough understanding of the present invention. It will be apparent, however, to one skilled in the art that the present invention may be practiced without these specific details. In other instances, well known components or methods have not been described in detail but rather in a block diagram in order to avoid unnecessarily obscuring the present invention. Thus, the specific details set forth are merely exemplary. The specific details may be varied from and still be contemplated to be within the spirit and scope of the present invention. The term coupled is defined as meaning connected either directly or indirectly.

In general, a method, apparatus, and system determine the allocation of the one or more redundant components while fault testing the memory. In an embodiment of an apparatus, one or more memories and one or more processors are located on a single chip. Each memory has one or more redundant components associated with that memory. The one or more redundant components include at least one redundant column. The one or more processors contain redundancy allocation logic having an algorithm. The algorithm determines the allocation of the one or more redundant components to repair one or more defects detected in the one or more memories while fault testing the memory.

Figure 2:
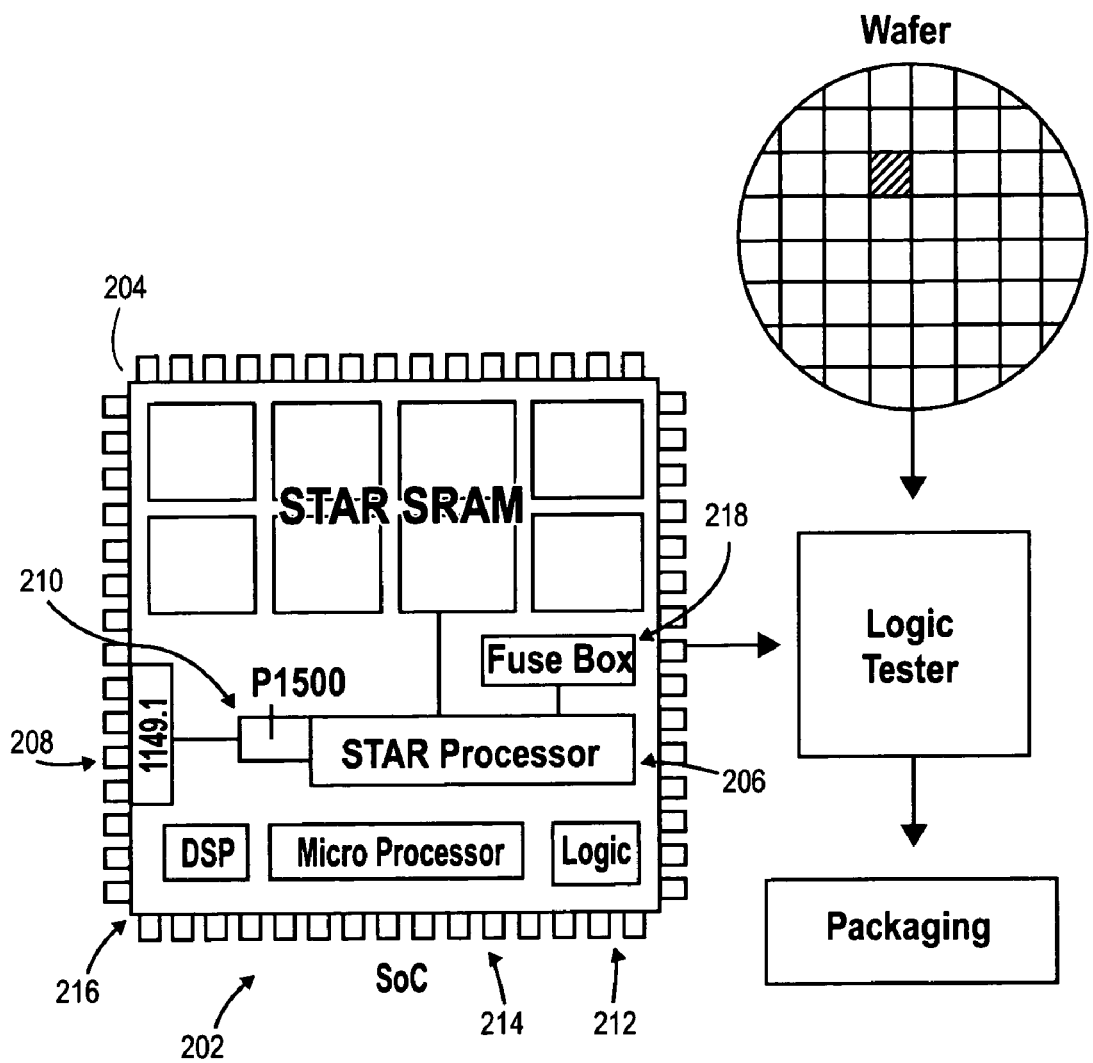
FIG. 2 illustrates an embodiment of a block diagram of one or more memories with each memory having one or more redundant components associated with that memory and a processor containing redundancy allocation logic.

FIG. 2 illustrates an embodiment of a block diagram of one or more memories with each memory having one or more redundant components associated with that memory and a processor containing redundancy allocation logic. In an embodiment, the chip 202 may contain a system of integrated components such as one or more memories 204, one or more processors 206, one or more external interface 208, one or more internal interfaces 210, one or more logic sections 212, one or more microprocessors 214, one or more digital signal processors 216, and one or more fuse boxes 218. In an embodiment, the one or more memories 204 may be a volatile memory such as, static random access memory (SRAM). In an embodiment, the processor 206 may be an application specific processor, such as a self-test and repair processor (STAR). In an embodiment, redundancy allocation logic (not shown) contained in the processor may have an algorithm to allocate the one or more redundant components (not shown), such as redundant columns and redundant rows, while fault testing each memory 204. In an embodiment, the one or more external interfaces 208 may be a IEEE 1149.1 interface. In an embodiment, the one or more internal interfaces 210 may be an IEEE P1500 interface.

The processor 206 enables a complete embedded memory self-test and repair function to be included on-chip 202. The processor 206 increases the yield of useable memories 204 by repairing defective memory components at a very high rate. In an embodiment, the processor 206 contains multiple engines to determine how much redundancy is needed and how to partition the redundant components throughout each unique memory array. The processor 206 understands the redundancy scheme, the failure history of the process being used, and how the unit has failed.

The processor 206 on the chip 202 that automatically tests the memory 204 allocates redundancy resources and coordinates or performs any necessary repairs. In an embodiment, the processor 206 tests the memory instances 204 at speed; that is, at the speed they will run in the application. After testing and repair of the memory instances 204, the processor 206 turns the memory operation over to the normal address, data and control busses on the SoC.

The repair data signature created by the processor 206 is sent to an external tester (not shown) via the one or more external interfaces 208. In an embodiment, the processor 206 communicates the repair data signature during wafer probe. In an embodiment, the laser repair equipment (not shown) programs the fuse box 218 with the necessary repair information. The fuse box 218 retains the permanent memory repair signature unique to that individual SoC 202. The signature can be executed either at wafer sort or at system power-on. In an embodiment, the processor 206 determines and stores the repair data signature in order to eliminate the need for a fuse box 218. In an embodiment, the processor 206 after system power-on transfers the corresponding repair data signature directly into the scan flip-flops contained within each unique memory instance 204 in the SoC 202.

In an embodiment, the processor 206 may perform all the appropriate testing and repair coordination of the memory instances 204 in order to increase yield, eliminate expensive external memory testers, and allow test and repair functions to occur in the field rather than at the factory. In an embodiment, the only factory testing required is to test the logic portion of the SoC 202 and, if applicable, coordinate the fuse box 218 programming. Thus, testing and repair of the memory instances 204 may occur in the field. In an embodiment, the processor 206 reduces the previous techniques of having four external test stages (memory test, laser repair, memory re-test, logic test) to one external test stage (logic test). In an embodiment, if a hard repair is used then there may be three external test stages, i.e. memory test, laser repair, and memory retest.

The system supports both factory and field repair methods. Factory repair takes place during wafer probe in the factory, using the laser programmed fuse box 218. Field repair uses a test and repair function residing in the processor 206 to make repairs after product deployment.

The factory repair has the advantage of performing test and repair at the wafer level. The wafer 220 can be subjected to a variety of stringent conditions during testing that helps insure high memory instance 204 and SoC 202 reliability during extended voltage, temperature and frequency conditions.

The field repair operation tests and repairs memory instances 204 each time the end product powers up or is reset. The processor 206 initiates and operates the test program, determines defective memory locations (if any), allocates redundancy resources, and produces a repair signature that resides in a location on the memory 204. This volatile repair signature is applied to the redundancy control logic and remains there as long as power is applied.

The field repair feature allows a new test every time the processor 206 is powered up or reset under control of the application's software but it is performed at ambient temperature and typically under non-stressful conditions.

The SoC 202 supports both repair functions: factory repair for manufacturing defects, and field repair for any subsequent problems that may materialize over the life of the end product.

Figure 3:
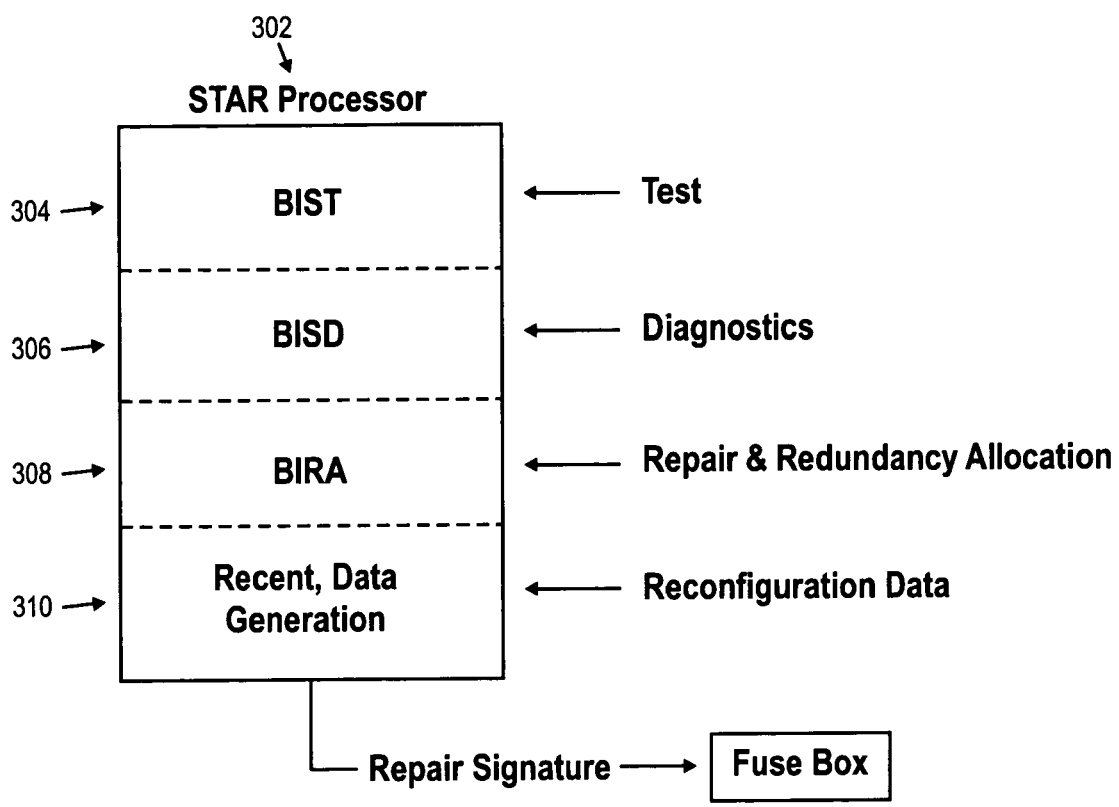
FIG. 3 illustrates an embodiment of a block diagram of a processor containing multiple engines such as a built in self-test engine, a built-in self-diagnosis engine, a built-in redundancy allocation engine, and reconfiguration data engine.

FIG. 3 illustrates an embodiment of a block diagram of a processor containing multiple engines such as a built in self-test engine, a built-in self-diagnosis engine, a built-in redundancy allocation engine, and reconfiguration data engine. The processor 302 is programmed by a set of instructions, which control logic in the processor such as several engines. The BIST engine 304 (Built-in Self-Test) performs tests, e.g. foundry-specific test algorithms, designed to detect defects in the memories. The BISD engine 306 (Built-in Self-Diagnosis) determines the location of the memory defects (if any) and provides error logging and scan-out failure date if required for failure analysis. The BIRA engine 308 (Built-in Redundancy Allocation) identifies and allocates available redundant rows and redundant columns in order to determine the optimum redundancy scheme when a failure occurs.

Figure 4:
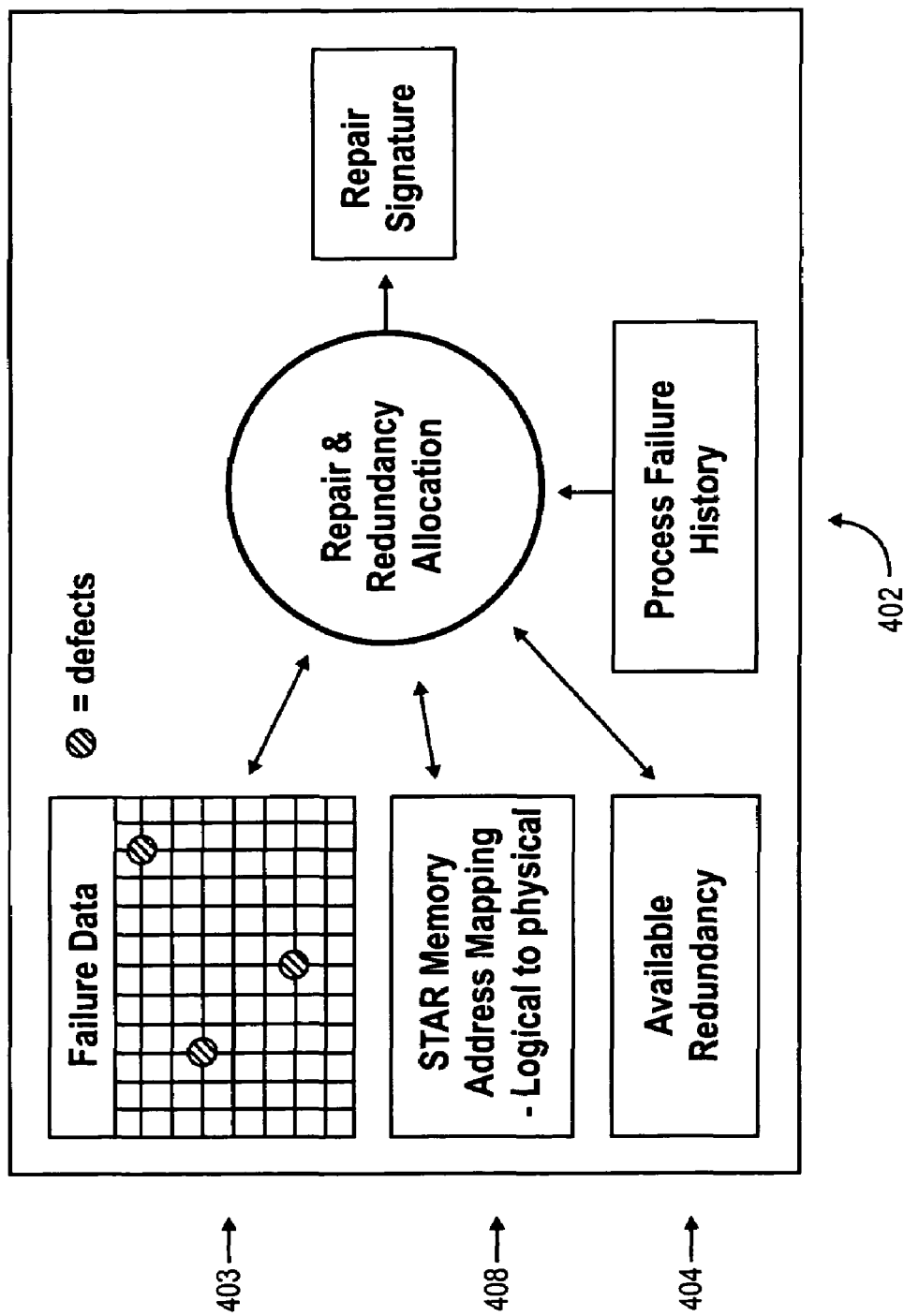
FIG. 4 illustrates an embodiment of a block diagram of the Built-in Redundancy Allocation (BIRA) engine examining information from a database to create a repair signature.

FIG. 4 illustrates an embodiment of a block diagram of the Built-in Redundancy Allocation (BIRA) engine examining information from a database to create a repair signature. The BIRA engine examines information from a database such as process failure history 402, address mapping, available redundancy 404, and the current fault data specific to each unique memory. In an embodiment, the process failure history 402 is fixed information per memory technology consists of failure data 406 from the specific foundry, which assigns higher probability weights to components that typically fail. In an embodiment, the address mapping is fixed information per memory design. In an embodiment, the available redundancy 404, and the current fault data are flexible information per chip.

Referring to FIG. 3, the processor can use the BISD engine 306 to find the defects and the BIRA engine 308 to repair the memory. The BIST engine 304 runs a test program to detect faults in the memory array. The BIRA engine 308 allocates the available redundant components to repair the memory and sends the repair information to the Reconfiguration Data engine 310. The Reconfiguration Data engine 310 translates redundancy allocation into a memory-specific repair signature that can be both sent to the external memory tester to be programmed into a fuse box or sent directly to scan chain registers in the memories themselves.

Figure 5:
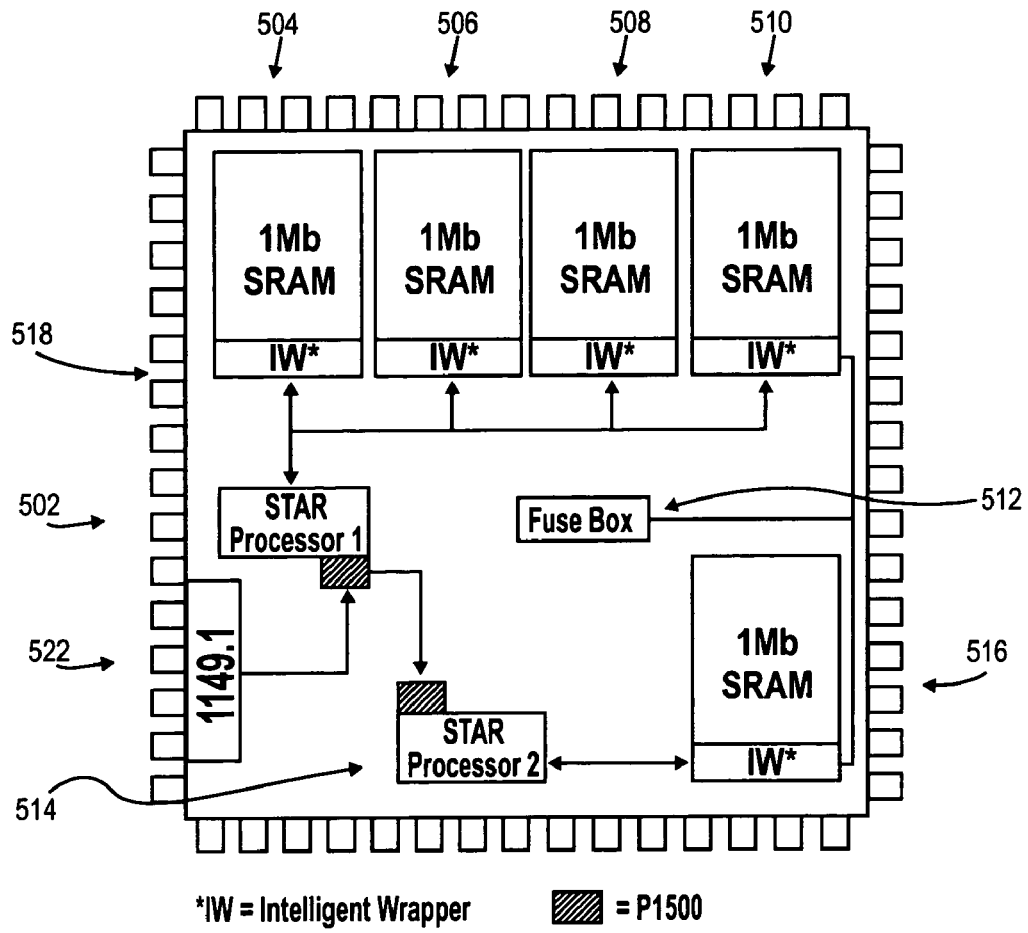
FIG. 5 illustrates a block diagram of an embodiment of one or more processors to test and repair several memory instances, either running in parallel or one at a time.

FIG. 5 illustrates a block diagram of an embodiment of one or more processors to test and repair several memory instances, either running in parallel or one at a time. The first processor 502 couples to a first memory 504, a second memory 506, a third memory 508, and a fourth memory 510. The first processor 502 may test all four memories 504, 506, 508, 510 one at a time or in parallel. The first processor 502 generates a discrete repair signature for each of the four unique memories. The first processor 502 can both send the repair signature to the fuse box 512 for all four unique memories 504, 506, 508, 510 or send the repair signature directly into scan chain registers in each unique memory 504, 506, 508, 510. The second processor 514 may couple to a fifth memory 516 and the fuse box 512. In an embodiment, all of the memories 504, 506, 508, 510, 516 may be the same size, such as one megabyte of SRAM, or not necessarily the same size. Accordingly, the size and redundancy structure of the fifth memory 516 may be different, such as five hundred and twelve kilobytes, than the first group of memories 504, 506, 508, 510. Placement of the memory instance and processor on the chip are dependent on several factors, such as area, power, speed, system clock, busses and the chip's floor plan. A single fuse box 512 can serve all memory instances on the chip.

In an embodiment, an extension of the processor is the Intelligent Wrapper (IW) 518 for example, at the first memory. The intelligent wrapper 518 associated with each memory instance 504, 506, 508, 510 is used in conjunction with the processor 502 to perform test and repair of the memory as well as allow normal memory functioning in the system. The intelligent wrapper 518 contains functions such as address counters, registers, data comparators and multiplexors. The intelligent wrapper 518 is located close to the memory core to allow at-speed testing of these functions. Thus, the processor 502 in conjunction with its intelligent wrapper 518 increase useable memory yields due to the processor's 502, 514 ability to detect nearly all defects, including performance defects that external memory testers commonly miss because they cannot run tests at chip speed. Further, the processor's 502, 514 on-chip repair function allows in the factory repairs and in the field repairs. The external interface 522, such as the standard JTAG 1149.1 port, enables the one or more processors to communicate with the chip's other IP cores.

Figure 6:
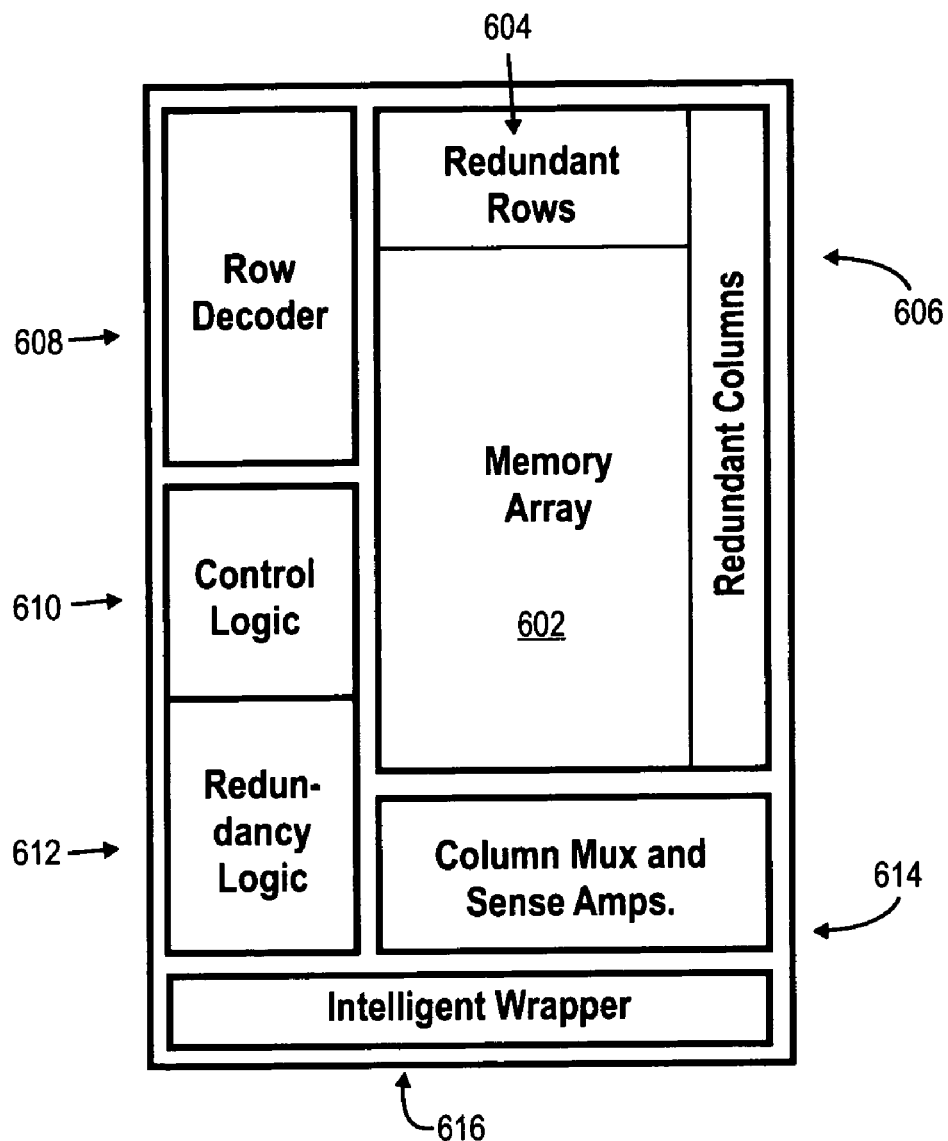
FIG. 6 illustrates a block diagram of an embodiment of a memory.

FIG. 6 illustrates a block diagram of an embodiment of a memory. In an embodiment, a memory may contain components such as the memory array 602, redundant rows 604, redundant columns 606, row decoders 608, control logic 610, redundancy logic 612, column multiplexors and sense amplifiers 614. The memory may be coupled with the intelligent wrapper 616. The memory array 602 may consist of memory bit cells organized by rows and columns. The row decoder 608 generates an address for a specific bit cell or grouping of bit cells such as a word line. The column multiplexors and sense amplifiers 614 read and write data signals into specific locations within the memory array 602 based upon the signal from the row decoder 608. The redundant rows 604 and redundant columns 606 substitute for defective components within the memory. For example, the memory may have a defective memory cell or a defective input output circuit coupling to that memory cell and depending upon the algorithm the processor may replace that defective component with a redundant row 604 or redundant column 606. The redundancy logic 612 coordinates the substitution of the non-redundant components with redundant components.

Figure 7:
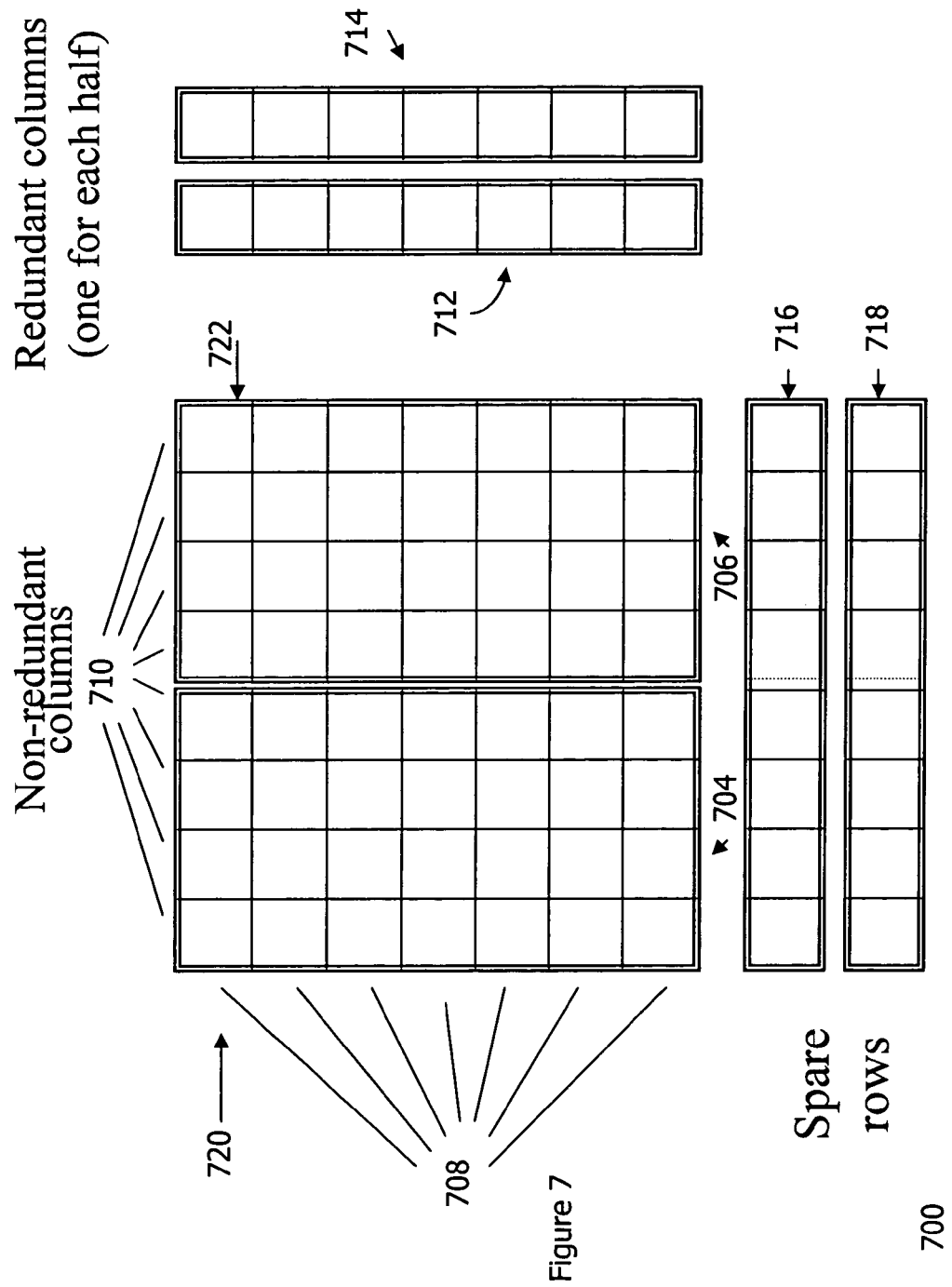
FIG. 7 illustrates an embodiment of a block diagram of a memory array split into banks and redundant components associated with that memory array.

FIG. 7 illustrates an embodiment of a block diagram of a memory array 700 split into banks and redundant components associated with that memory array 700. The memory array 700 contains memory cells. In an embodiment, the memory cells are organized by bank 704, 706, comprised of row 708, and columns 710. Each memory array 700 may be split up, for example, a lower bank 704 and an upper bank 706, for organization purposes. The lower bank 704 contains seven rows 708, e.g. horizontal word lines of memory cells, and four columns 710, i.e. vertical bit lines. A memory array 700 may be split up into any number of banks but two will be illustrated and described to demonstrate aspects of the invention. The memory array 700 may have one or more redundant columns 712, 714 and one or more redundant rows 716,718. A memory array 700 may have any number of redundant components but two rows and two columns will be illustrated and described to demonstrate aspects of the invention. A first redundant column 712 may substitute for a defective column in the lower bank 704. A second redundant column 714 may substitute for a defective column in the upper bank 706. A first redundant row 716 may globally substitute for a defective row in either the lower bank 704 or the upper bank 706. For example, if two defects exist in the top word line 720 in the lower bank 704, such as the top set of four horizontal memory blocks contained in the lower bank 704, then the first redundant row 716 may be globally substituted for the top word line 720 in the lower bank 704 and the top word line 722 in the upper bank 706. Similarly, a second redundant row 718 may globally substitute for a defective row in either the lower bank 704 or the upper bank 706 or both. In an embodiment, the BIRA algorithm may march through lower bank while simultaneously in parallel march through the upper bank.

Figure 8:
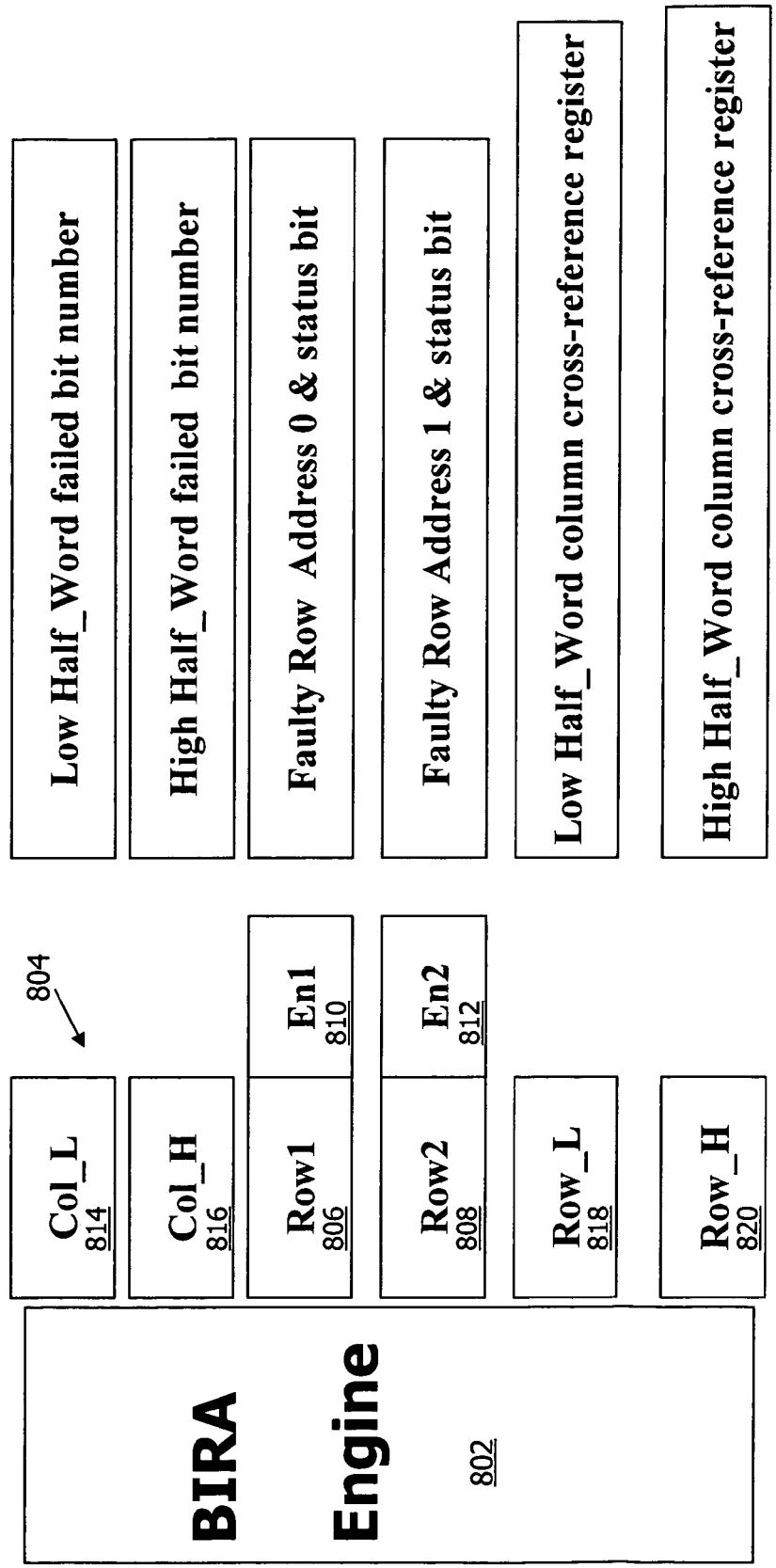
FIG. 8 illustrates an embodiment of a block diagram of the built in redundancy engine having a plurality of registers.

FIG. 8 illustrates an embodiment of a block diagram of the built in redundancy engine having a plurality of registers. The Built-In Redundancy Analysis (BIRA) engine 802 allocates the redundant components, such as one or more redundant columns and the one or more redundant rows, while BIST engine is still fault testing each unique memory cell. After detecting a defective cell in the memory array, the BIST engine sends the corresponding macro-cell address of the defective cell to the engine implementing one of the BIRA algorithms. The processor explores the contents of the set of registers 804 where the information for final self-repair is stored and changes the contents if necessary. If the memory is diagnosed as repairable the final contents of the registers contain the addresses of rows and columns to be replaced with the corresponding spare elements.

In an embodiment, the plurality of registers may be as follows. Row register-Row_1 806, and row register Row_2 808 record the faulty row addresses. Thus, each row register 806, 808 may identify and store the address of a faulty row. In an embodiment, the amount of row registers equals the number of redundant rows. Status bit register-En1 810 and status bit register-En2 812 record the status of redundant row registers. These status bits indicate that the corresponding addresses recorded must be selected for repair if the memory is declared repairable after BIST. Thus, the status bit registers 810, 812 indicate whether the corresponding redundant row is available or unavailable as a substitute row. In an embodiment, the BIST and BIRA operations are performed simultaneously.

Similarly, status bit register-CL (not shown) and status bit register-CH (not shown) record the status of redundant column registers. The status bit registers indicate whether the corresponding redundant column is available or unavailable as a substitute column. Column register Col_L 814 and column register Col_H 816 record the faulty column addresses located in the lower bank and upper bank, respectively. In an embodiment, the total amount of status bit registers equals the number of redundant rows plus the number of redundant columns.

Cross-reference row register-Row_L 818 and cross-reference row register Row_H 820 record the row addresses connected with the faults recorded in column registers Col_L 814 and Col_H 816. Each cross reference register allows an assigned redundant column, thus unavailable, to be released and reset to available status, if an assigned redundant row will also be substituting for the defective memory cell that the assigned redundant column was substituted for. In an embodiment, the BIRA engine 802 may couple to additional registers, such as sub input output registers which together with the column registers 814, 816 specify the faulty column addresses of sub input output circuits associated with each memory array.

The BIRA engine 802 processes one or more built-in-redundancy-analysis algorithms to determine whether a memory is repairable. The BIRA engine 802 takes into consideration the process failure history, address mapping, and examines information about available redundancy, and the current fault data that is specific to each unique memory. The BIRA engine 802 combines this information and sends the information to the Reconfiguration Data engine to translate the redundancy allocation into a memory-specific repair signature.

In an embodiment, the organization and sequence of how the BIRA engine 802 assigns the redundant components determines whether a memory array will be repairable or not repairable, thereby, increasing or decreasing the yield of useable memories on the chip. The BIRA engine 802 may use many discrete algorithms, however, a one or more algorithms will be described and illustrated to demonstrate aspects of the invention.

A first Built-In-Redundancy-Analysis algorithm is based on the following main logic steps.

First, if at least two faulty cells are encountered in a word either in the lower bank or the upper bank of the memory array, then the row requires repair with a redundant row. If an available redundant row does not exist, then the memory array is considered unrepairable.

Second, if a single faulty cell is encountered in a word either in the lower bank or the upper bank of the memory array then a redundant column is used for repair, if available. If no spare column is available but a spare row is available, then a redundant row is used for repair. Otherwise, the memory array is considered unrepairable.

Third, the BIRA engine 802 works in parallel with the BIST logic providing the fault data. Thus, the BIRA engine 802 may possess three states of decision regarding the assignment of redundant components to substitute for defects in the memory detected by BIST logic. In an embodiment, the three states of decision are not set, tentatively set, and locked in. The starting state of decision for redundant rows and redundant columns is not set. Not set means that the component is available to be assigned to substitute for a defective component.

As noted in the first logic step, if at least two faulty cells are encountered in a word, then a redundant row is assigned to substitute for the defective component. In this case, the BIRA engine 802 locks in the state of decision for this redundant row to substitute for the defective row. Thus, this particular redundant row is now unavailable to be assigned to replace another defective component. Note, the redundant row globally replaces the entire row in both the lower bank and the upper bank irrespective of whether the two fault cells exist in the upper bank or in the lower bank or in both.

As noted in the second logic step, if a single faulty cell is encountered in a word, then a redundant column is the first choice to substitute for the defective component. The BIRA engine 802 tentatively sets the state of decision for this redundant column to substitute for the defective component. Thus, this particular redundant column is currently unavailable to be assigned to replace another defective component; however, the status of this redundant column may be released back to available upon certain conditions. If a new fault is encountered requiring repair with a redundant row, (i.e. at least two faulty cells are encountered in a word) and a faulty row is connected with an assigned redundant column, i.e. the corresponding cross-referencing registers contain the same address as the faulty row, then the corresponding column register is reset together with the status bit register and cross referencing register. The released redundant column has become available for further repair purposes and the newly assigned redundant row satisfies the first logic step to have a locked in state of decision. If an available redundant row does not exist, then the memory array is considered unrepairable.

Fourth, the BIRA algorithm may use a marching algorithm, which sequentially examines the addresses of the memory array. The BIRA algorithm may make several passes to attempt to repair a memory. If at least one of the BIRA algorithms passes eliminates all of the defective components in the memory through redundant component substitution, then the state of decision for each redundant memory component is locked in. The memory is repaired. The BIRA engine 802 sends the repair information to the Reconfiguration Data generation engine.

Figure 9:
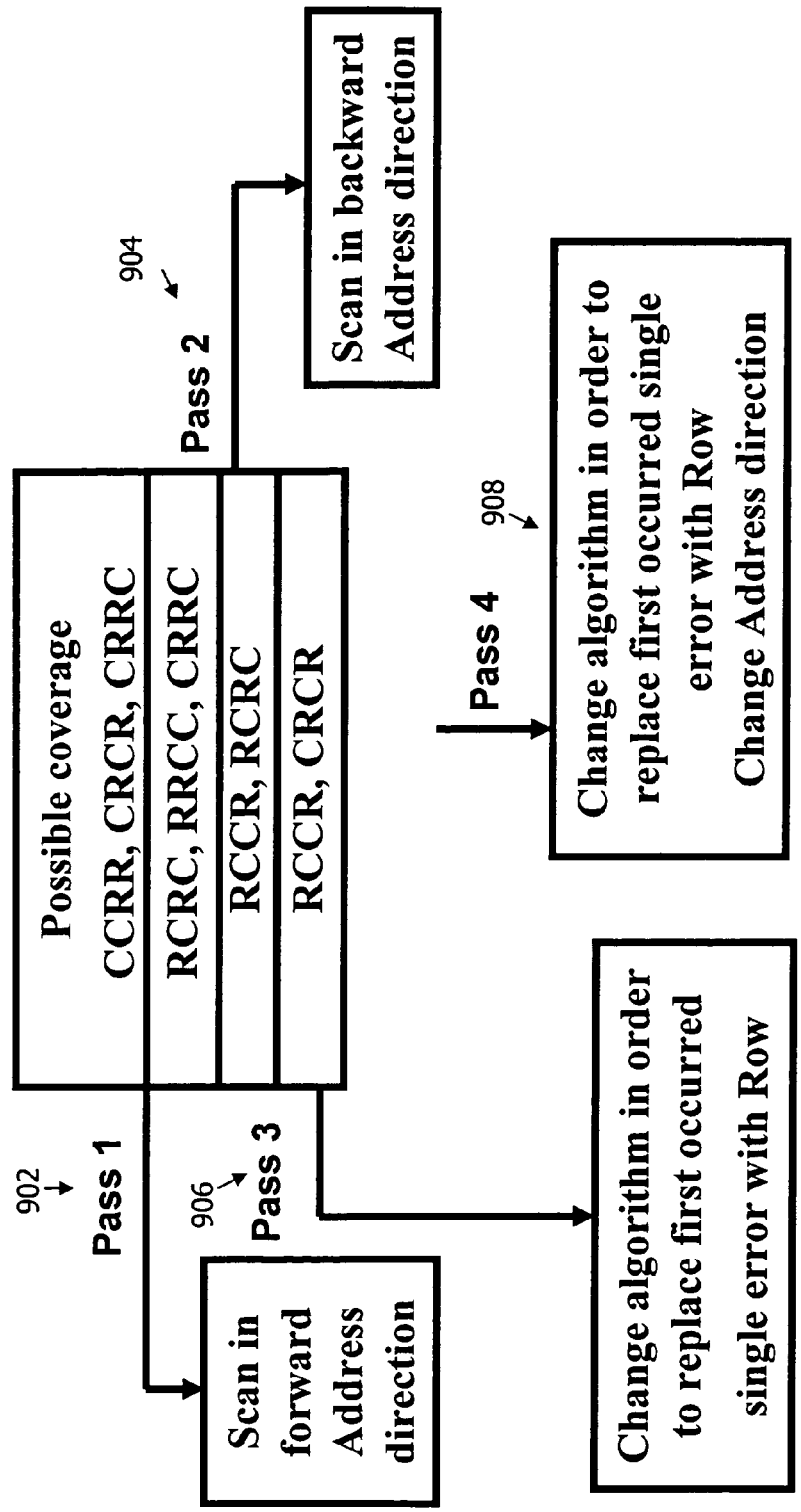
FIG. 9 illustrates a block diagram of an embodiment of a four pass testing pattern for an embodiment of a BIRA algorithm.

FIG. 9 illustrates a block diagram of an embodiment of a four pass testing pattern for an embodiment of a BIRA algorithm. Note, the BIRA algorithm may contain testing patterns to make one or more passes but a four-pass routine will be used as an example. On the first pass 902, the BIRA algorithm sequentially examines the memory array to substitute redundant component for defective components. The BIRA algorithm examines the memory array in the forward direction. Thus, the BIRA algorithm starts examining the lowest memory address and marches sequentially through to the highest memory address of the memory array under analysis. On the second pass 904, the BIRA algorithm examines the memory array in the backward direction. Thus, the BIRA algorithm starts examining the highest memory address and marches sequentially through to the lowest memory address of the memory array under analysis.

On the third pass 906, the BIRA algorithm alters the second logic step to choose to replace a single defective memory cell with a redundant row rather than a redundant column. The BIRA engine sets the state of decision for that assigned redundant row as tentatively set. On the fourth pass 908, the BIRA algorithm does both alter the second logic step to choose to replace a single defective memory cell with a redundant row rather than a redundant column and examines the memory array in the backward direction.

Figure 10:
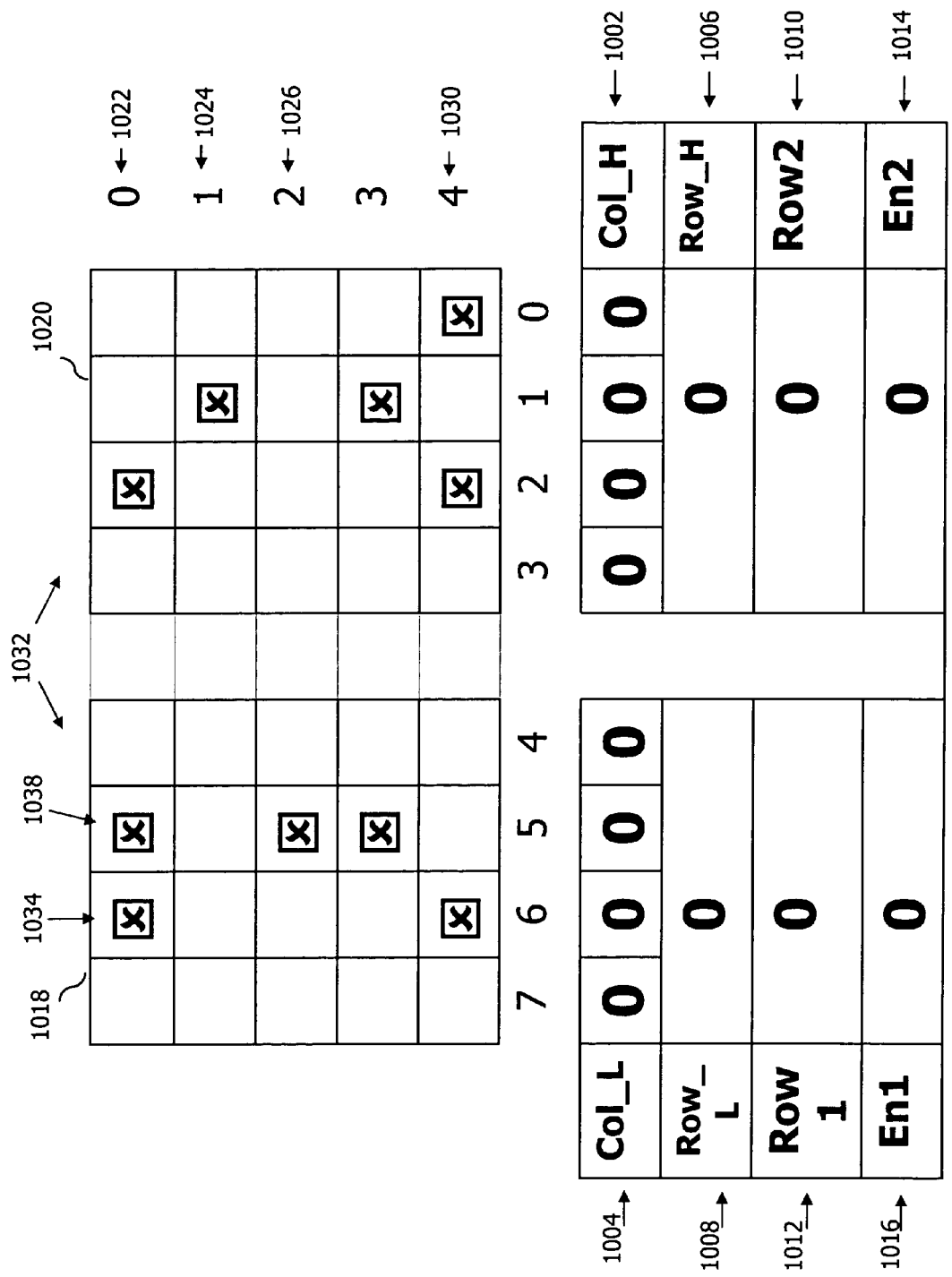
FIG. 10 illustrates an exemplary use of an embodiment of a first BIRA algorithm and the starting condition for the BIRA registers.
Figure 11:
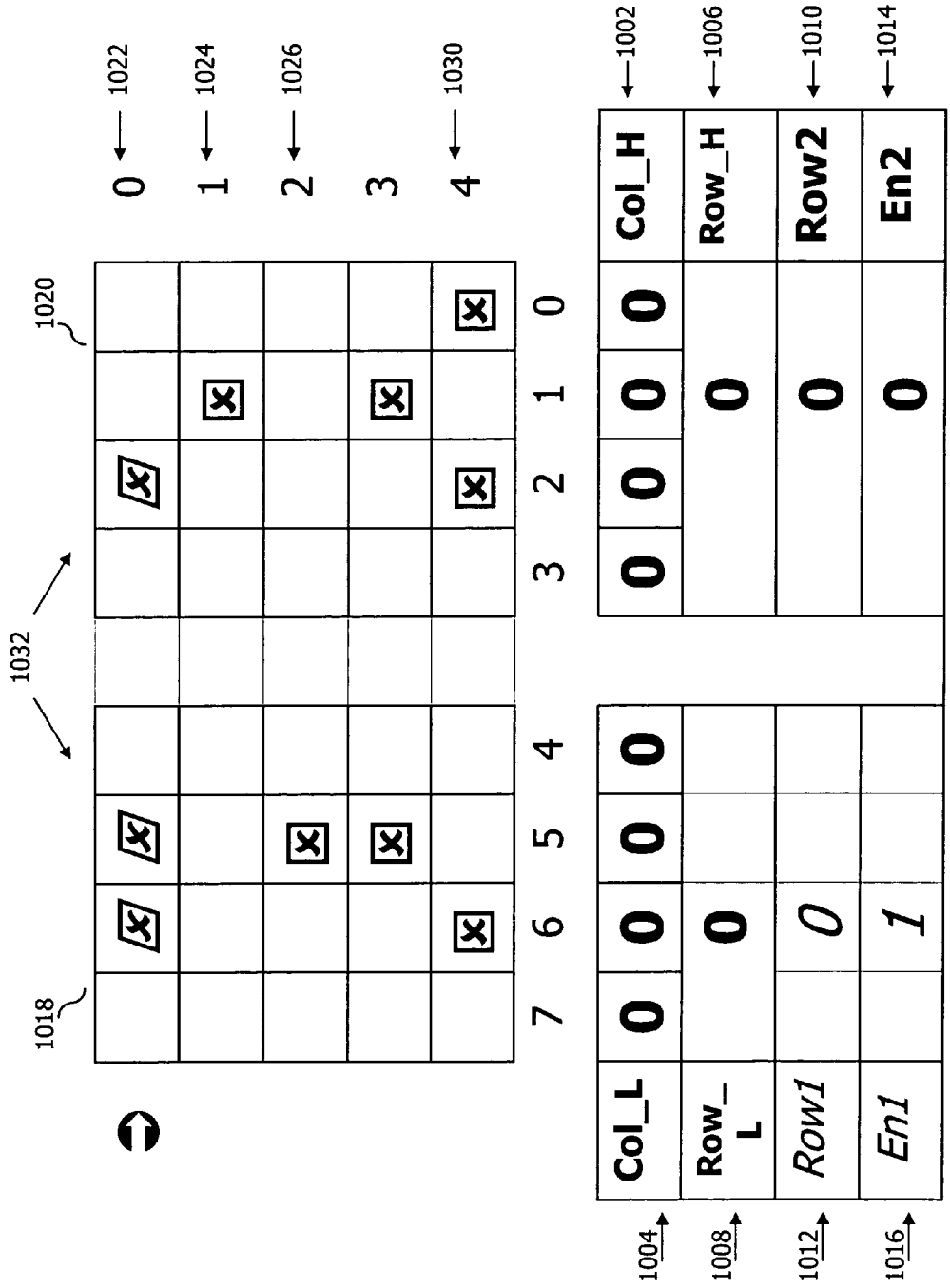
FIG. 11 through FIG. 15 illustrate an exemplary use of a first BIRA algorithm using the first pass to detect errors and assign redundancy allocation in the memory array.

FIG. 10 illustrates an exemplary use of an embodiment of a first BIRA algorithm and illustrates the starting condition for the BIRA registers. In an embodiment, starting condition for the BIRA registers, is a "0" contained within all of the registers. Thus, the column registers 1002, 1004 contain a starting status of "0". Similarly cross-reference registers 1006, 1008, the row registers 1010, 1012, and the status bit registers 1014, 1016 all contain a starting status of "0".

The memory array 1032 is split into two halves a lower bank 1018 and an upper bank 1020. Many word lines exist in each bank. For example, the top horizontal grouping of memory blocks is a word line, in the lower bank 1018. Similarly, the top horizontal grouping of memory blocks in the upper bank 1020 is an example of a word line. The row address spans from row address 0 1022 through row address 4 1030. And the column address spans from address 0 through address 7. Note this is just an exemplary memory array 1032 and how a first BIRA algorithm might be employed.

The BIST program sends data to the BIRA engine indicating the location of faulty memory cells, such as a first faulty memory cell 1034 located in the first word line 1036 contained within the lower bank 1018. The first faulty memory cell 1034 is located at row address 0 1022 and also at column address 6. Located next to the first faulty cell 1034, going horizontally, is a second faulty memory cell 1038 constituting a second fault or defect with in the first word line 1036. In an embodiment, when the BIRA algorithm encounters two faulty cells in a single word line, a first logical steps dictates that a redundant row will be substituted for the defective component.

A faulty memory cell could be an actual faulty defective bit cell within the memory, a defective multiplexor or sense amp going to that bit cell, a faulty input output circuit routing to that cell, some interconnection between those components going to that cell or some other condition to render the memory location inoperable. In an embodiment, a redundant component, such as either the redundant row or the redundant column, has the necessary components within the redundant component to substitute for any of those defects.

The exemplary use of the BIRA algorithm assumes that the memory array 1032 has two redundant columns, a first redundant column and a second redundant column as shown in FIG. 7. The exemplary use of the BIRA algorithm also assumes that the memory has two redundant rows, a first redundant row and a second redundant row. Additionally assumed is that the memory array 1032 has been split into an upper bank 1020 and a lower bank 1018. The specific amounts of components and the types of components are just examples to illustrate an embodiment of the invention. One or more of any of these components could exist. In an embodiment, the BIRA algorithm examines these variables as shown in FIG. 4.

FIG. 11 through FIG. 15 illustrates an exemplary use of a first BIRA algorithm using the first pass to detect errors and assign redundancy allocation in the memory array. Thus, the BIRA algorithm starts examining at the lowest memory address and works its way to the highest memory address. At the same time the BIRA algorithm conducts its fault analysis, the BIRA algorithm also assigns redundant components. The BIRA algorithm starts by detecting two faults in the first word line. Thus, according to the first logical step when multiple errors are encountered, the defective component, in this case, a defective row, is substituted with a redundant row. Therefore, the first redundant row is substituted for the defective row in row address 0 1022. To reflect these changes, the BIRA engine changes the contents in row register-Row1 1012 to record the address of the faulty row, in this case row address-0 1022. Further, the BIRA engine changes the contents in status bit-En1 1016 to contain a logical 1. A logical 1 in status bit register-En1 1016 indicates that first redundant row is now unavailable as a substitute component. The algorithm continues to march sequentially through the memory addresses of the memory array 1032 and detects a third faulty cell in column address 2 in the upper bank 1020. The algorithm references the contents of row register-Row1 1012 to find out that this fault is already substituted by a redundant component. Thus, the BIRA algorithm proceeds down to the second word line contained in the lower bank 1018.

Figure 12:
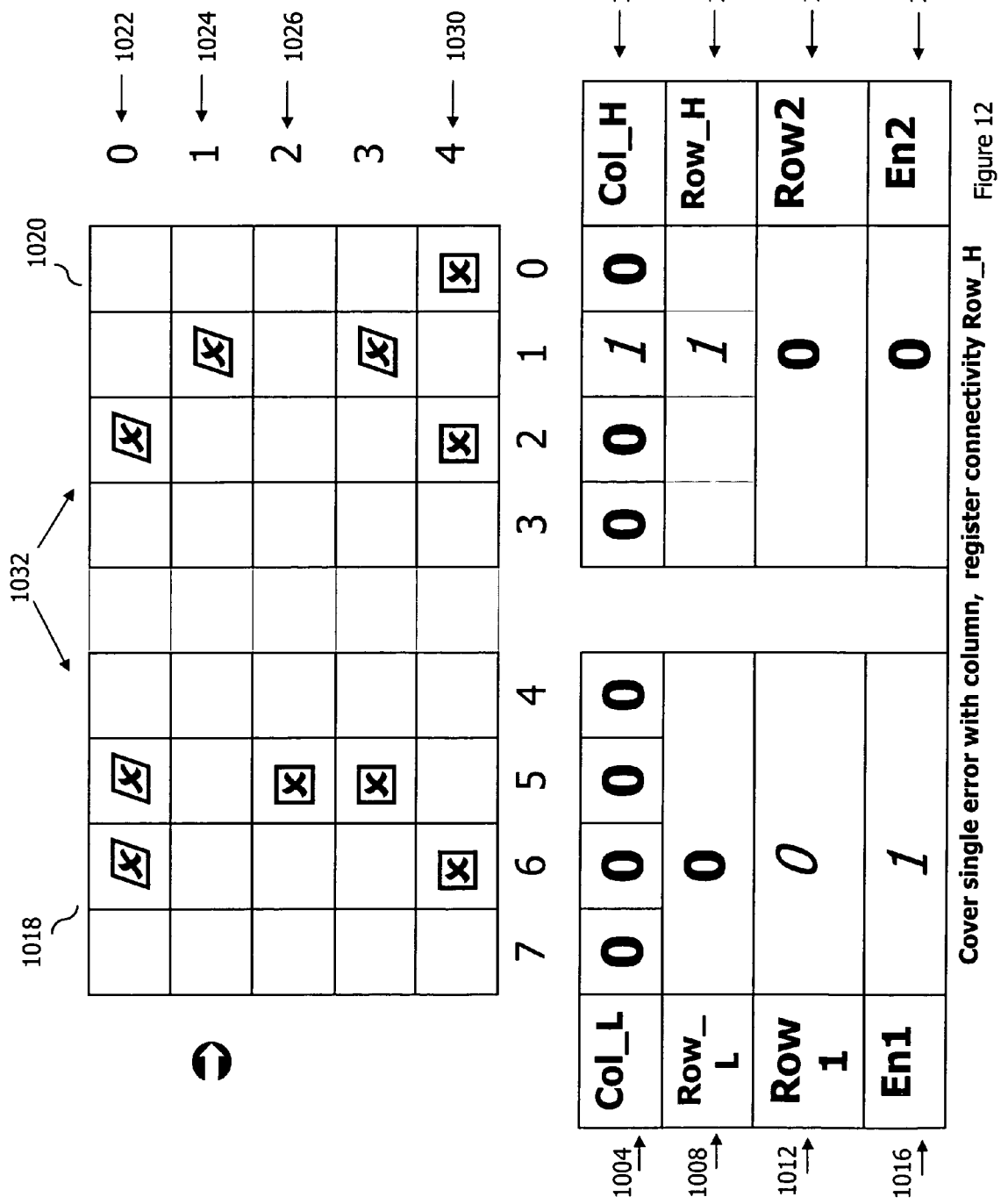

Referring to FIG. 12, the BIRA algorithm continues marching in a forward direction on the first pass through the addresses of the memory array 1032. The BIRA algorithm finishes its analysis of row address 0 1022 and starts its analysis of row address-1 1024. The BIRA algorithm detects a fourth faulty cell in the upper bank 1020 in the second word line. The BIRA algorithm determines that this is a single faulty cell contained in a word line and therefore follows the second logical step to replace the single faulty cell with a redundant column. The BIRA engine changes the contents in column register-Col_H 1002 from a logical 0 to a logical 1 to indicate the column address of the defective component. The cross-reference register Row_H 1006 changes it's content to reflect a 1 which is the row address connecting or cross referencing the defective row with the defective column.

Figure 13:
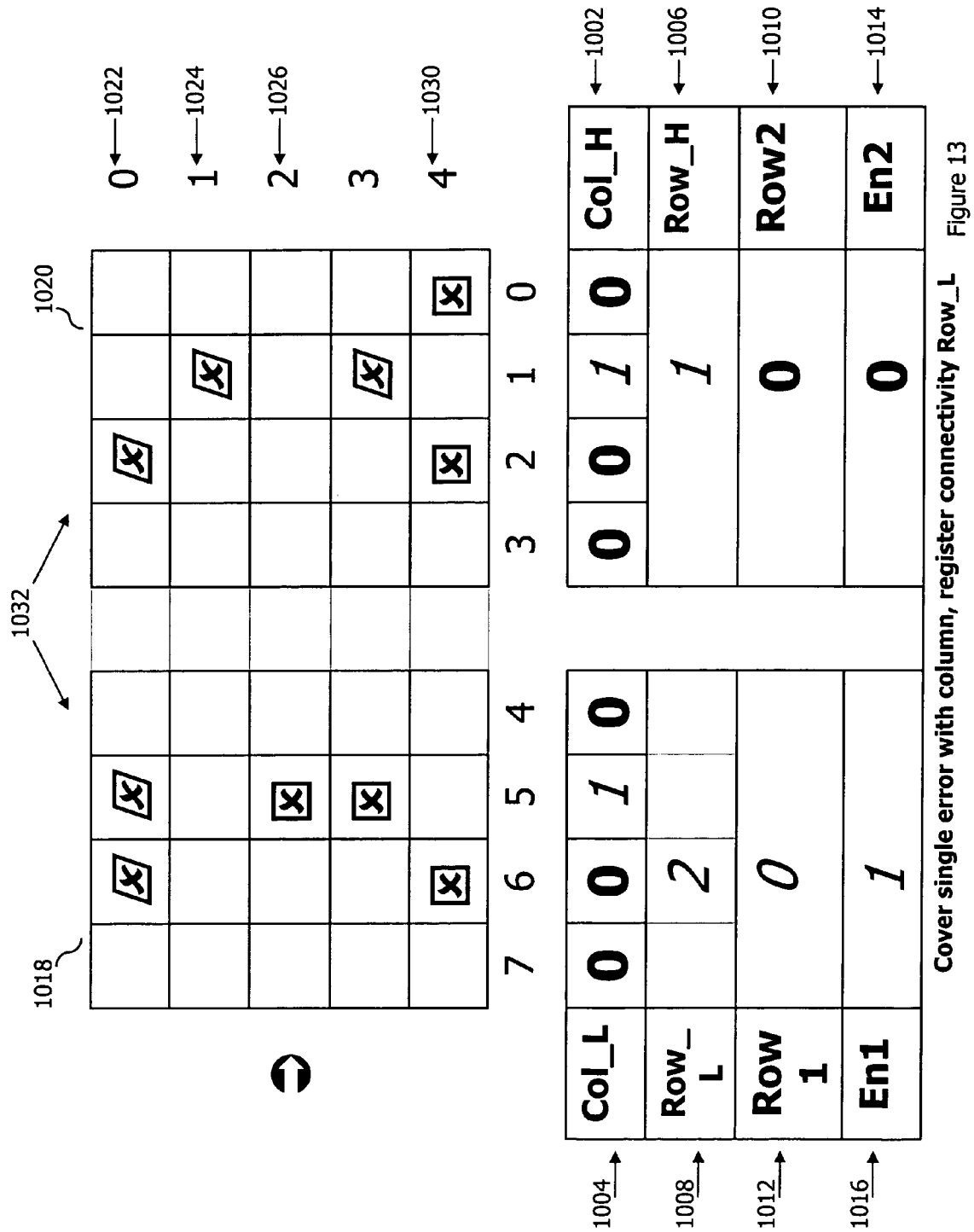

Referring to FIG. 13, FIG. 13 illustrates the first BIRA algorithm continuing its forward march on the first pass through the memory array 1032. The BIRA algorithm detects a fifth faulty memory cell in the third word line contained in the lower bank 1018. According to the second logical step, since the BIRA algorithm detects only a single error, the BIRA algorithm assigns a redundant column to substitute for the defective faulty component. Thus, the BIRA engine changes the contents in column register Col_L 1004 to record a logical 1 in memory block corresponding with fifth column address to indicate that the second redundant column has been assigned to substitute for the fifth memory column in the fifth address slot. The BIRA engine changes the contents in cross reference register Row_L 1008 to record row address 2 1026, in order to reflect the row address corresponding to the defect which caused the redundant row to be assigned to that defective column. The second redundant column replaces the defective column in fifth address slot, which is reflected by the contents in the column register Col_L 1004 and cross reference register Row_L 1008.

Figure 14:
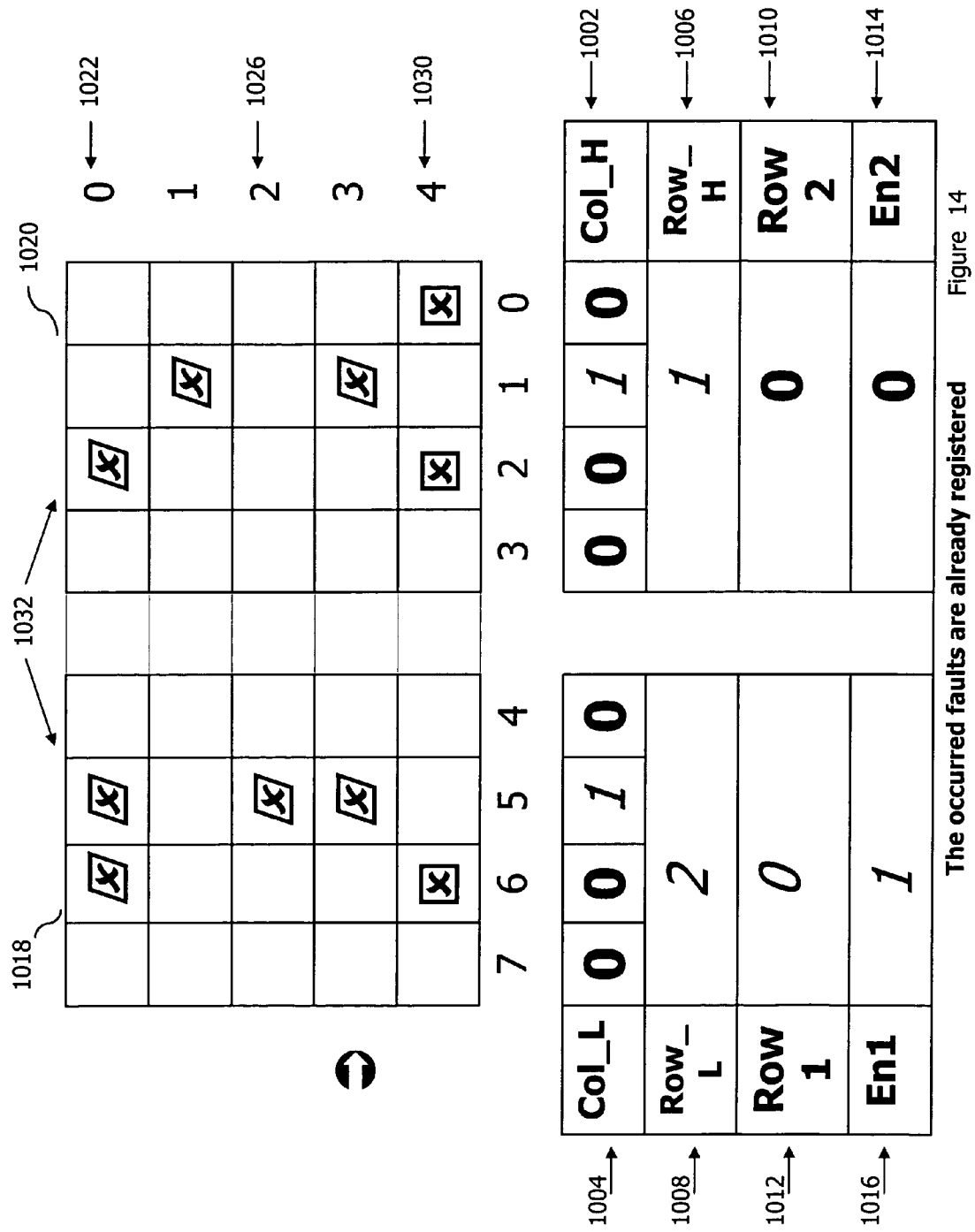

Referring to FIG. 14, FIG. 14 illustrates the BIRA algorithm continuing a forward march through the memory array 1032 on the first pass. The BIRA algorithm examines the fourth word line in both the lower bank 1018 and in the upper bank 1020. The BIRA algorithm detects a sixth memory fault in the lower bank 1018 occurring in the fifth column address. The BIRA algorithm references the BIRA registers and detects that the second redundant column has been assigned to substitute for this defective memory cell already through contents of column register Col_L 1004. The BIRA algorithm then continues its forward march through the memory array 1032 and discovers a single defect in the seventh faulty memory cell located within the upper bank 1020 occurring in column address 1. The BIRA algorithm references the BIRA registers and detects that the first redundant column has substituted for this defective component already. The BIRA algorithm references the column register Col_H 1002 and detects that the contents reflect column address 1.

Figure 15:
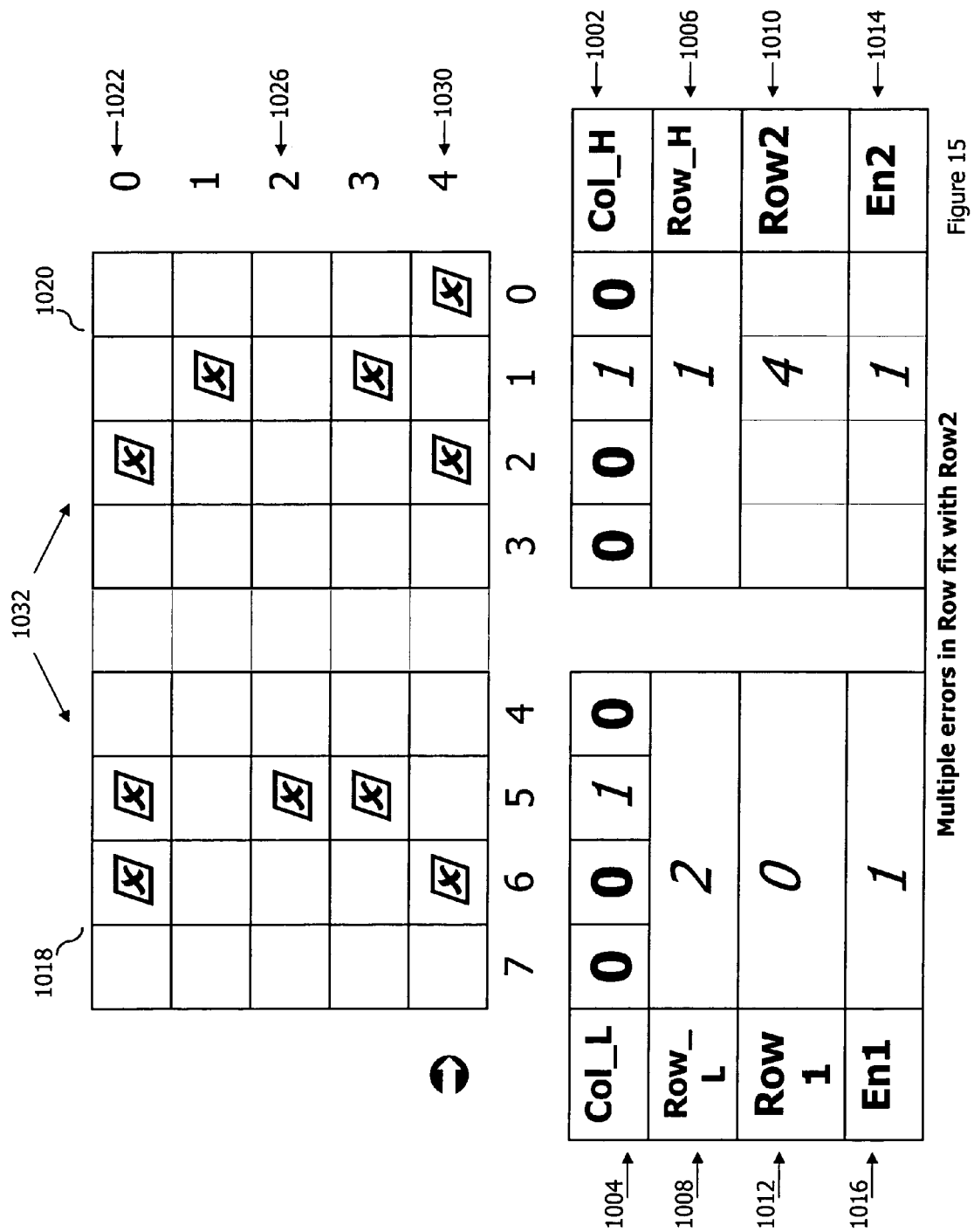

Referring to FIG. 15, FIG. 15 illustrates the first BIRA algorithms continued march through the memory array 1032 on the first pass. The BIRA algorithm examines defects in the fifth word line contained in the memory array 1032. The BIRA algorithm detects a single fault occurring in the fifth word line contained in the lower bank 1018. The eighth faulty memory cell is located in column address 6. The BIRA algorithm does not have any redundant columns left to replace this single fault with a redundant column, therefore according to the second logical step, the BIRA algorithm uses an available redundant row to replace this defective component.

Thus, the BIRA engine assigns the second redundant row to globally replace the bottom word line in the lower bank 1018 and the bottom word line in the upper bank 1020. The BIRA registers reflect this change. The BIRA engine changes the contents in row register Row2 1010 to reflect row address number 4 and stores the faulty row address in its contents. The BIRA engine changes the contents in status bit register En2 1014 to a logical 1 to indicate that the second redundant row is not longer available to substitute for the defective component. However, since a single fault was detected, then the state of decision for this redundant row is only tentatively set. The BIRA algorithm then proceeds to examine the memory addresses in the upper bank 1020 and detects multiple faults, a ninth faulty memory cell existing in column address 2 and a tenth faulty memory cell existing in column address 0. The BIRA algorithm references the BIRA registers and detects that row register Row2 1010 assigns the second redundant row to replace row address 4 1030. Therefore, the BIRA algorithm determines that these errors are already covered by a redundant component.

The BIRA algorithm then goes to the fourth logical step, once the highest memory address is achieved and checks to see if all the faults in this memory array 1032 were substituted by redundant components. In this example, the redundant components substitute for the defective components in order to replace every defect that occurred in this memory array 1032. The BIRA algorithm then determines that this memory array 1032 is repaired on the first pass. Therefore, the BIRA algorithm need not continue the BIRA algorithm with a second testing pattern such as a second pass, third pass, or fourth pass through this memory array 1032.

Once the BIRA algorithm determines that one of passes or testing techniques, in this case the first pass, was successful, then the BIRA algorithm locks in the state of decision contained in the BIRA registers for each redundant component and sends the fault information onto the reconfiguration data engine. Thus, this example illustrates an embodiment of how the BIRA algorithm performs dynamic allocation and swapping of redundant components while still testing or detecting faults in the memory. The BIRA algorithm may optimize the final organization and allocation of assigning redundant components in order to replace defective components associated with the memory.

Figure 16:
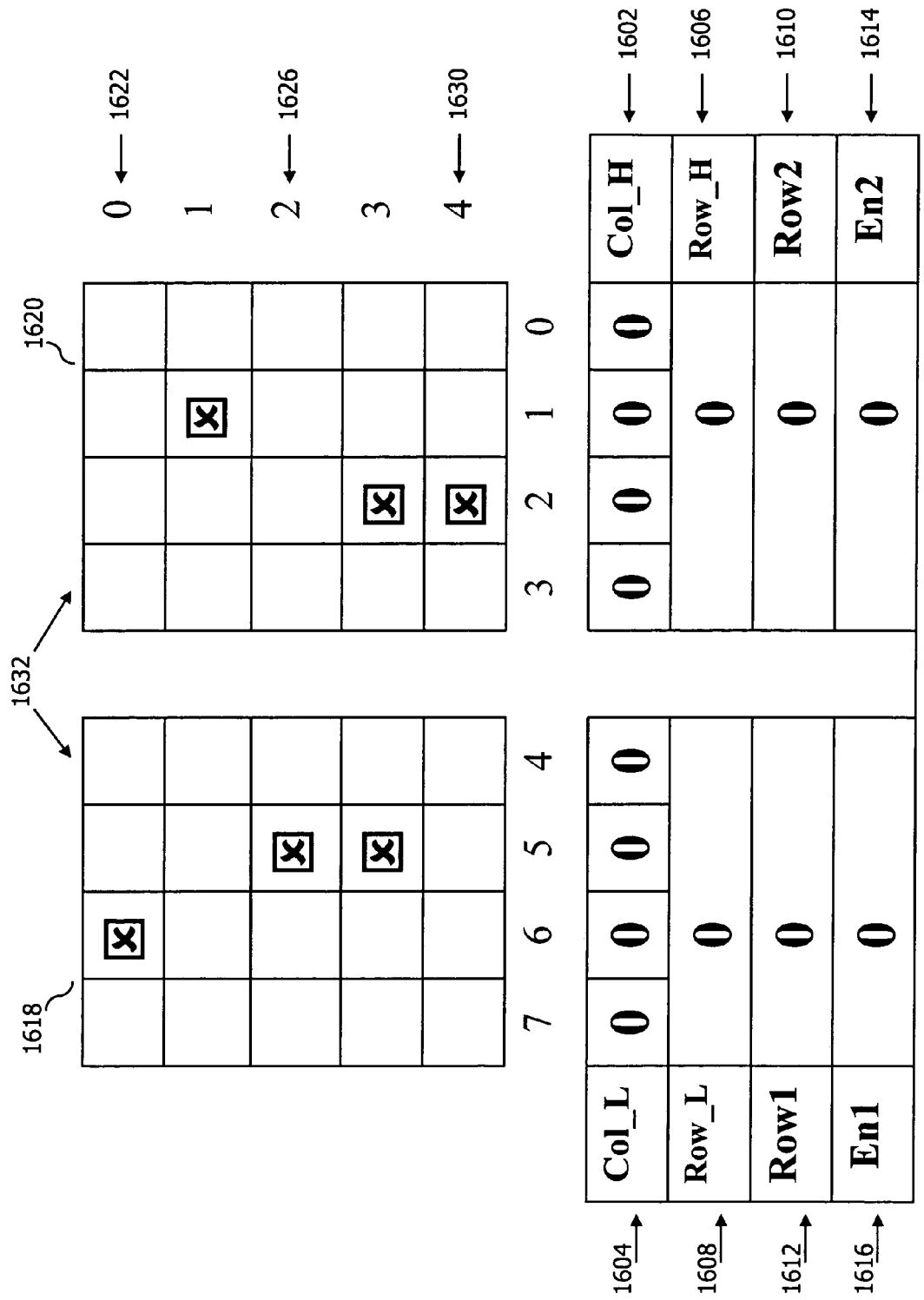
FIG. 16 through FIG. 25 illustrate an exemplary use of an embodiment of the BIRA algorithm making the necessary substitutions of the redundant components to fix the defects contained within the memory array using the second pass through the memory array.

FIG. 16 through FIG. 25 illustrate an exemplary use of an embodiment of the BIRA algorithm making the necessary substitutions of the redundant components to fix the defects contained within the memory array using the second pass through the memory array. FIG. 16 illustrates the starting condition of the BIRA registers and the BIRA algorithm when starting the first pass. In the memory array 1632, three defects exist in the lower bank 1618. A first faulty memory cell in the column address 6 contained in the first word line in the lower bank 1618 and two faulty memory cells, a second faulty memory cell and a third faulty memory cell, exist in column address 5 in the lower bank 1618. Three defective memory cells that exist in the upper bank 1620, a fourth defective memory cell in column address 1 in the upper bank 1620 and two faulty memory cells, a fifth faulty memory cell and a sixth faulty memory cell, exist in column address 2 in the upper bank 1620.

Figure 17:
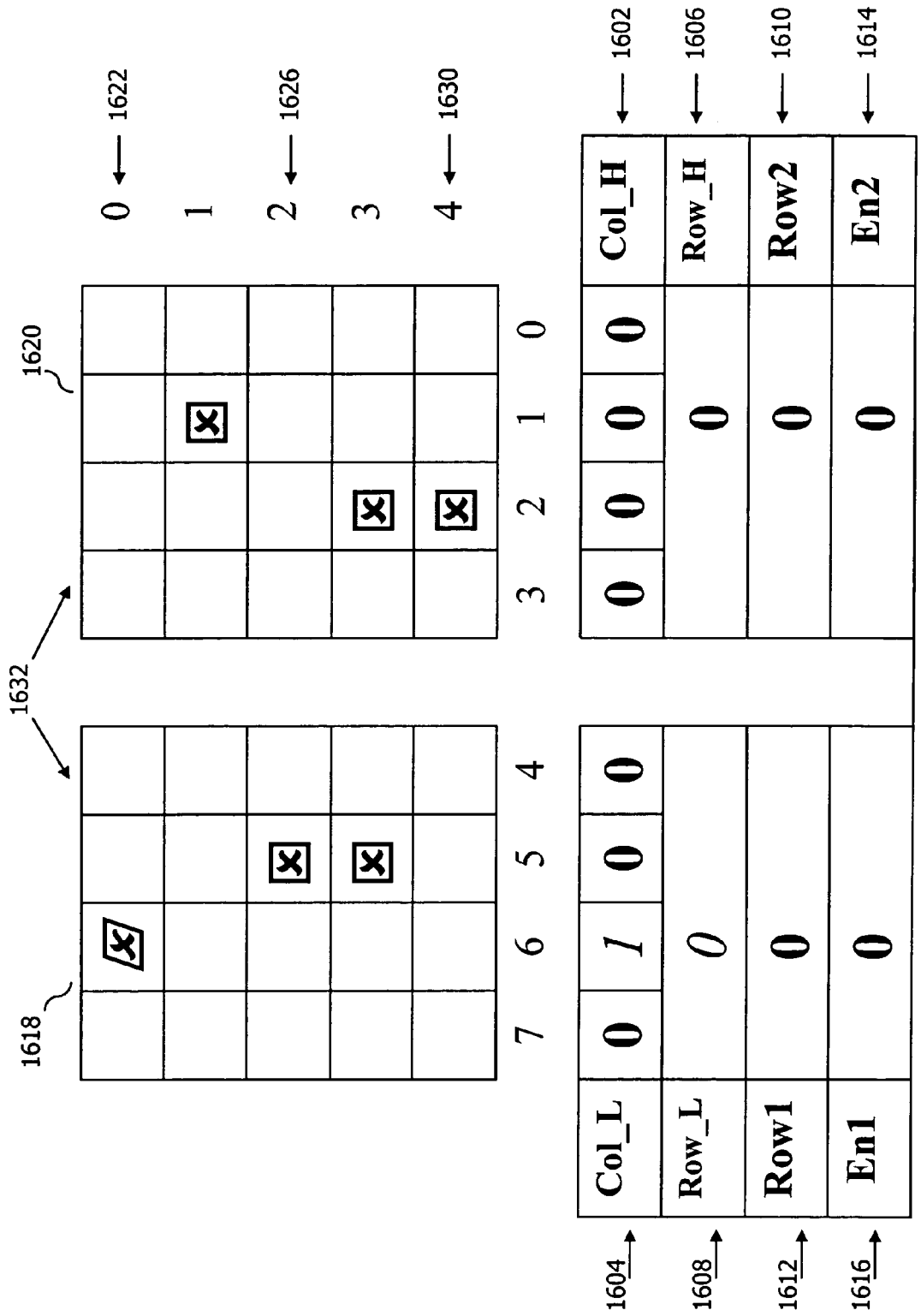

Referring to FIG. 17, the BIRA algorithm starts with the first pass. The BIRA algorithm encounters a first memory defect in the lower bank 1618 in the sixth column address. In a single fault failure the BIRA engine assigns a redundant column to replace the defective component and sets the state of decision as tentatively set. Column register Col_L 1604 changes the contents of its register to a logical 1 in the sixth column address position to reflect that the first redundant column has been assigned to replace the column in the sixth column address. Cross reference register Row_L 1608 changes the content in its register to read a logical 0 to indicate the first defective memory cell is also found in row address 0 1622.

Figure 18:
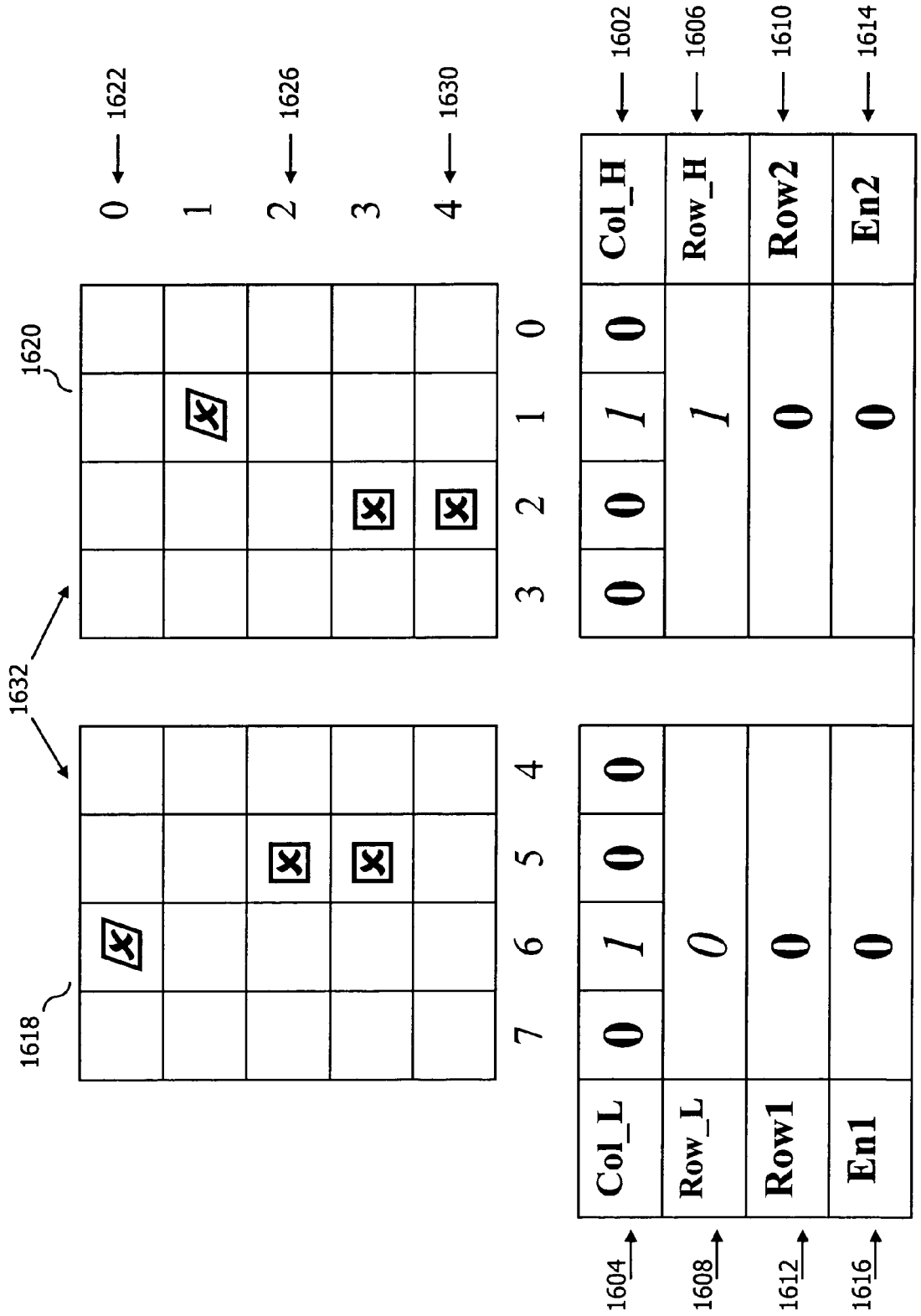

Referring to FIG. 18, the BIRA algorithm continues a forward march through the memory addresses by proceeding to the second word line. The second word line in the lower bank 1618 contains no defects. The BIRA algorithm does detect a defect in the second word line in the upper bank 1620 contained in column address 1. Upon detecting a single fault failure the BIRA engine assigns a second redundant column to replace the defective component. Column register Col_H 1602 changes the contents of its register to a logical 1 in the first column address position to reflect that the second redundant column has been assigned to replace column 1. Cross reference register Row_L 1608 changes the contents in its register to reflect that the memory defect covered by the second redundant column also occurs in row address 1 1624.

Figure 19:
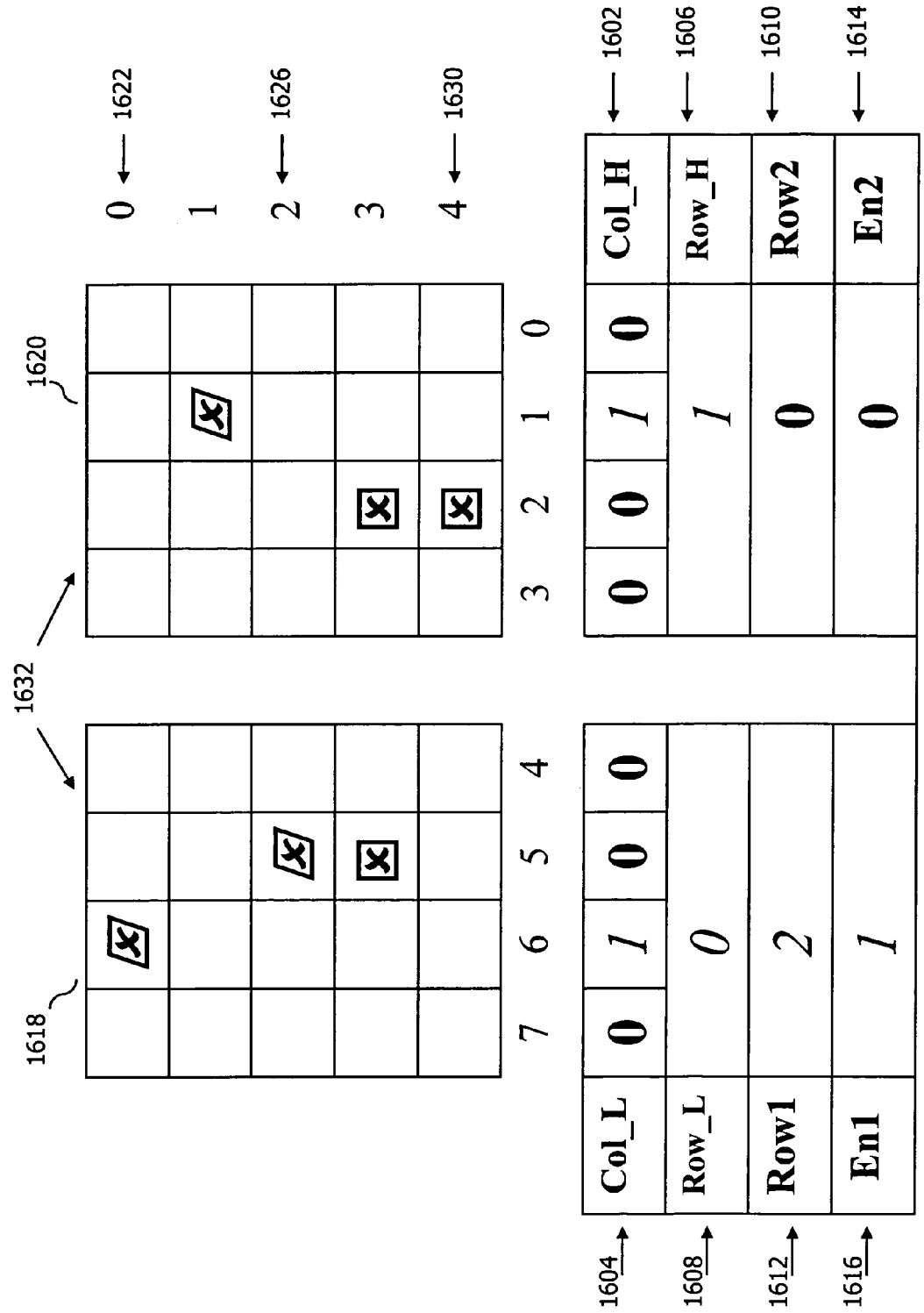

Referring to FIG. 19, the BIRA algorithm continues its march through the first pass of the memory addresses of the memory array 1632. The BIRA algorithm detects a fault in the third word line contained in the lower bank 1618 occurring in column address 5. Upon detecting a single fault failure, the BIRA algorithm would assign a redundant column to substitute for the defective component. However, according to the second logical step, if no redundant columns are available, then the BIRA algorithm assigns a redundant row. Row register Row1 1612 reflects the assignment of the first redundant row by recording the row address 2 1626 in its contents. Status bit register En1 1616 changes the contents in its register to a logical 1 to reflect that the first redundant row is no longer available to be assigned to substitute for a defective memory component.

Figure 20:
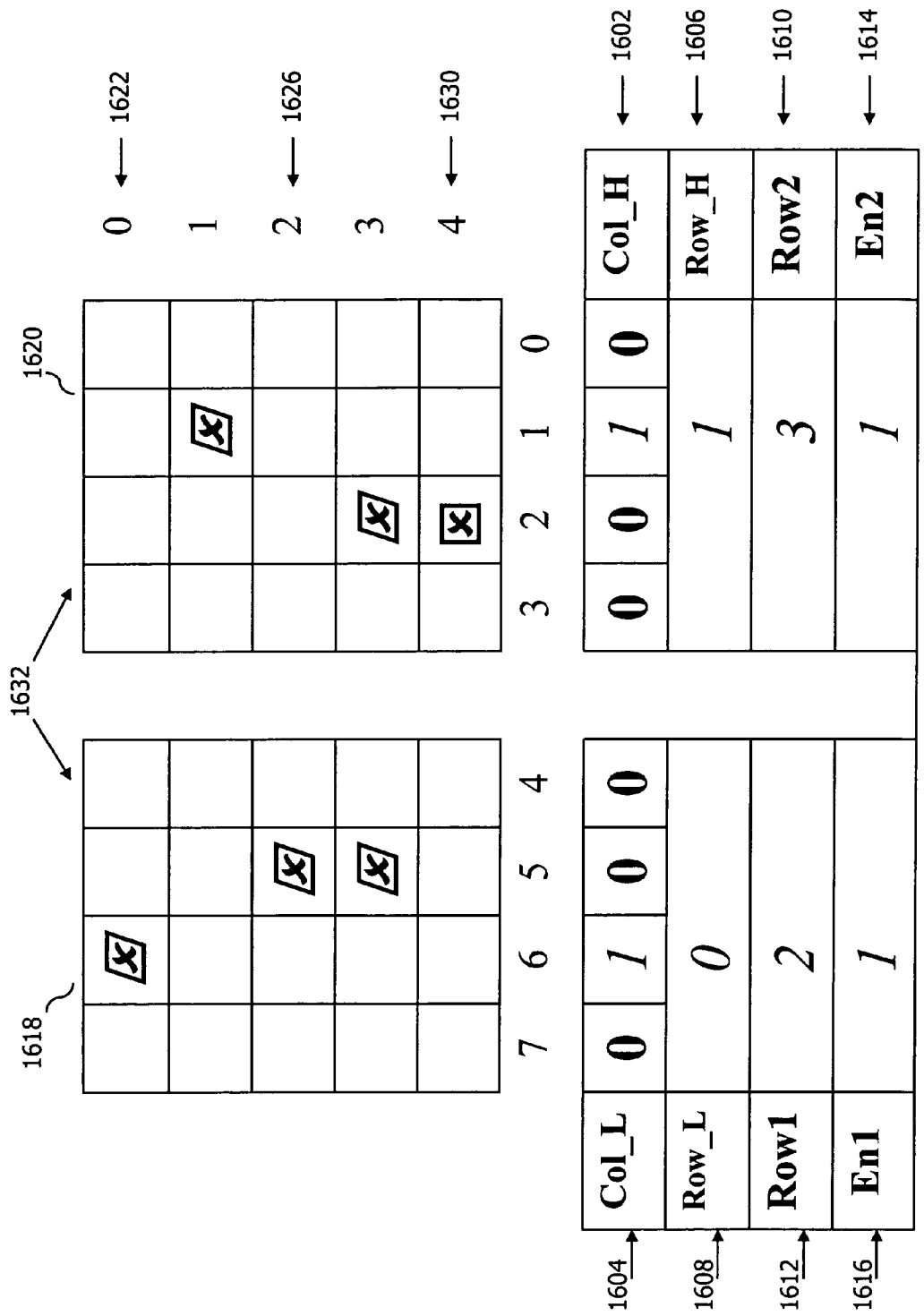

Referring to FIG. 20, the BIRA algorithm continues its forward march using the first pass through the memory array 1632 starting at the fourth word line in the lower bank 1618. The BIRA algorithm detects a single fault failure in the fourth word line in the lower bank 1618 occurring in column address 5. The BIRA algorithm having no redundant columns available assigns a redundant row to substitute for this defect. The BIRA registers reflect the assignment of the second redundant row by row register Row2 1610 changing the contents of its register to record row address 3 1628. Status bit register En2 1614 changes the contents in its register to a logical 1 to indicate that the second redundant row in no longer available to substitute for a defective component. The BIRA algorithm then proceeds to detect a defective memory cell in the upper bank 1620 contained in row address 3 1628. The BIRA algorithm references the BIRA registers to detect that the row register Row2 1610 contains a row address 3 1628 already, thereby, substituting the second redundant row covering that defective component.

Figure 21:
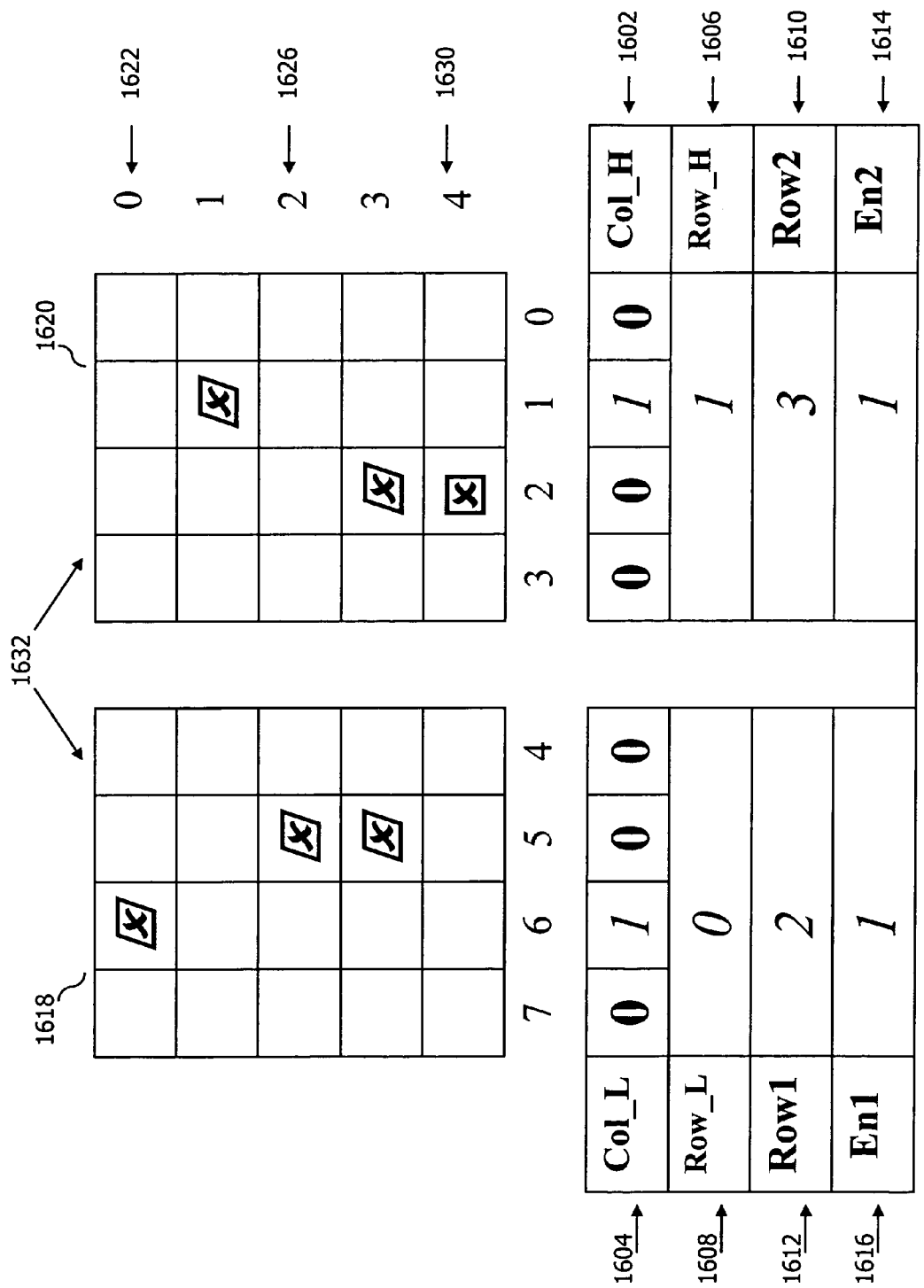

Referring to FIG. 21, the BIRA algorithm continues the forward march using the first pass though the memory array 1632. The BIRA algorithm detects a fault in the fifth word line in the upper bank 1620 in the column address 2. Upon detecting a single fault, the BIRA algorithm attempts to use a second logical step to assign a redundant column, however in this case all of the redundant columns have already been assigned. The BIRA algorithm references the BIRA registers and both column registers indicate that the redundant columns have been assigned and their corresponding status bit registers for those columns (not shown) indicate that those redundant columns have been assigned. The BIRA algorithm then tries to proceed to the second part of the second logical step and assign a redundant row to fix this error. However, the BIRA algorithm references the BIRA registers and discovers that the status bit registers for both redundant rows indicate that neither of the redundant rows is available to be assigned to substitute for a defective component. Therefore the BIRA algorithm determines that it has no available redundant components to assign to substitute for the defect found in the fifth word line in the upper bank 1620. The BIRA algorithm determines that the redundant component cannot be substituted and cover all the defects in the memory array 1632. The BIRA algorithm then proceeds by resetting all the registers and starting a second pass to try to repair this memory array 1632.

Figure 22:
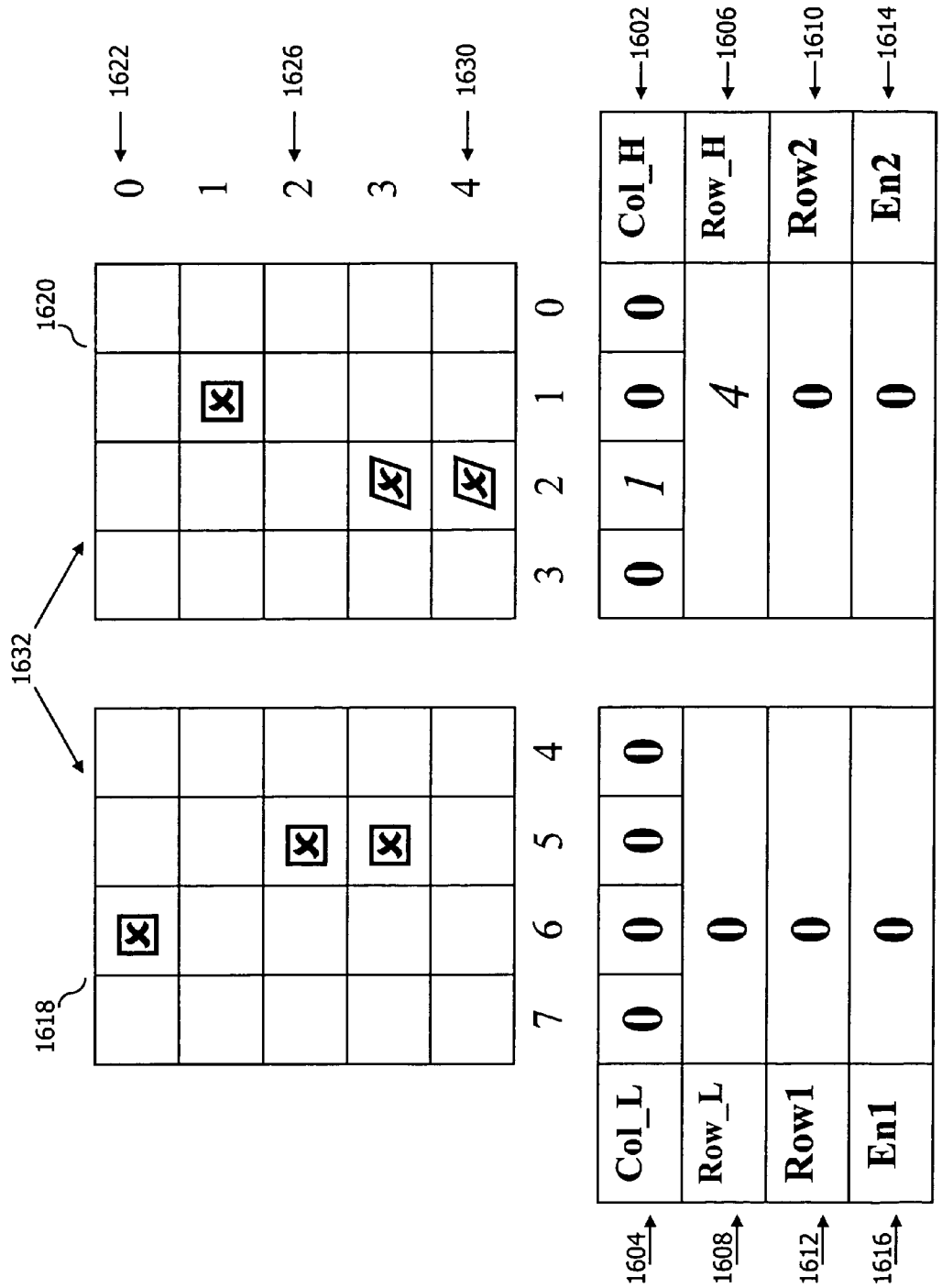

FIG. 22 illustrate an exemplary use of first BIRA algorithm commencing with the second pass through the memory array 1632 in an attempt allocate redundant components to repair the memory array 1632. The BIRA algorithm resets all the BIRA registers back to a starting condition containing a logical 0. Note, the starting condition of the BIRA registers could be any logical state as a starting condition, these numbers are just used as an example. The second pass of an embodiment of the BIRA algorithm proceeds marching in the backward direction. Thus, the BIRA algorithm starts with the highest memory address contained in the memory array 1632 and works sequentially through the memory address locations down to the lowest memory address. During the sequential march through the memory addresses the engine shall be assigning redundant components to replace defects it finds in the memory array 1632 while still sequentially marching through the memory array 1632 to find defects.

As noted, the BIRA algorithm commences the second pass by starting at the highest memory address and proceeding to the lowest memory address. The BIRA algorithm commences its sequential march through the memory addresses in the upper bank 1620 in the fifth word line. The BIRA algorithm detects a faulty memory cell in column address 2. The BIRA algorithm detects a single fault in the fifth word line and therefore, in accordance with the second logical step, assigns a redundant column to substitute for that defective component. The BIRA registers reflect the assignment of the first redundant column. Column register Col_H 1602 changes the its content to correspond to column address 2 to indicate that a first redundant column has been assigned to substitute for the defective second column. Cross-reference register Row_H 1606 changes the contents in its register to store the address of the corresponding row of this defective memory cell. Thus, cross-reference register Row_H 1606 changes its contents to reflect column address 4.

FIG. 22 also illustrates that the BIRA algorithm continues with its backwards march through the memory addresses in the memory array 1632 and detects a fault in the upper bank 1620 in column address 2 and cross referenced to row address 3 1628. The BIRA engine references the BIRA registers and detects that column row register Col_H 1602 indicates the first redundant column has already been assigned to replace the second column. Thus, the memory defect in row address 3 1628 falls within the same column being replaced by the first redundant column. Upon detecting that the redundant column covers this defect, the BIRA algorithm continues its backward march through the memory address.

Figure 23:
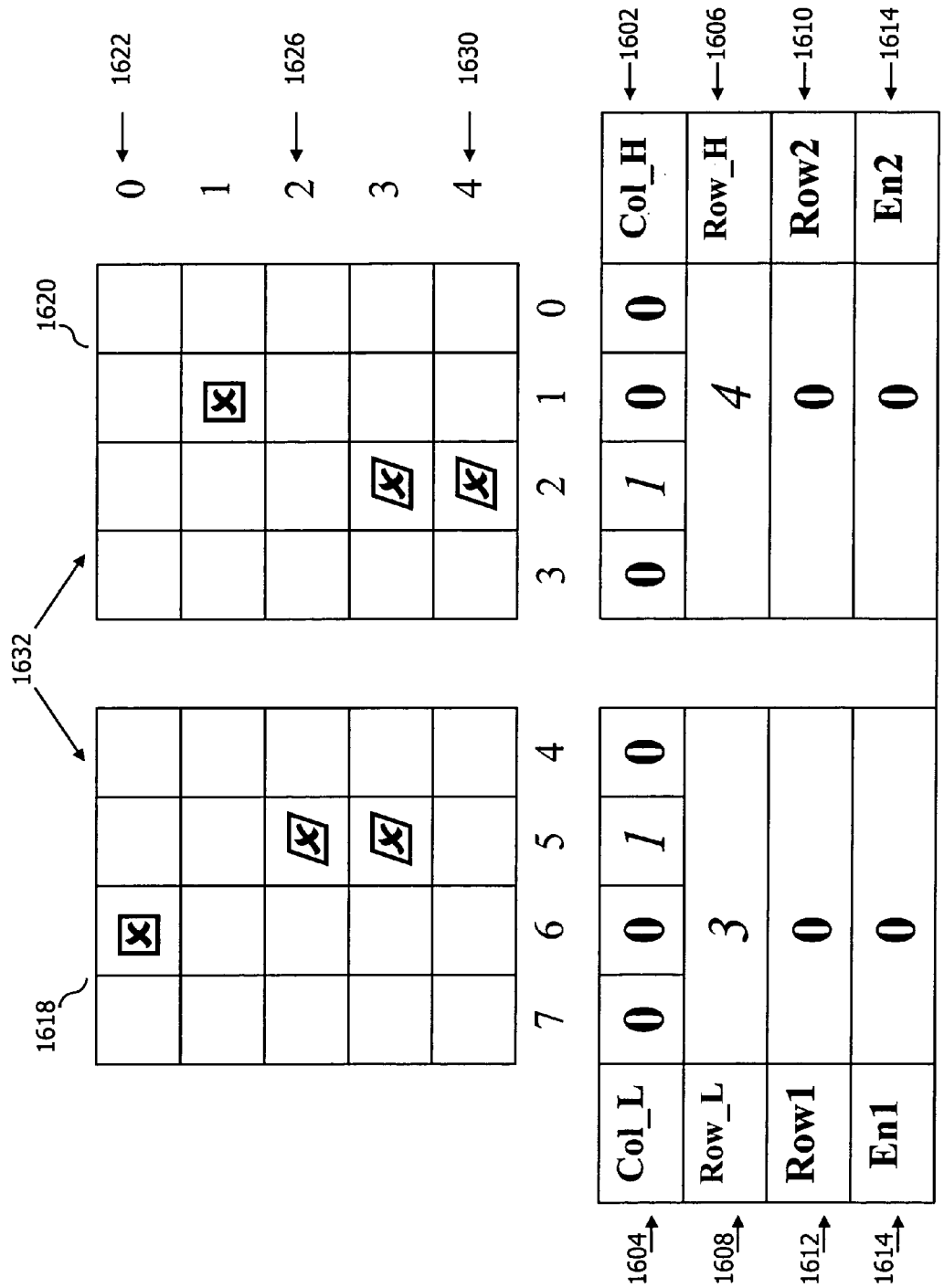

Referring to FIG. 23, the BIRA algorithm continues with its backwards march through the memory address in row address 3 1628. In the lower bank 1618, the BIRA algorithm detects a fault memory cell in the lower bank 1618 in column address 5. Upon detecting a single fault, the BIRA algorithm assigns a redundant column to replace the defective component. The BIRA registers reflect this assignment of the second redundant column. Column registers Col_L 1604 changes the content in the register corresponding to the fifth column address location to a logical 1. This indicates that the second redundant column has been assigned to substitute for a fifth column contained within the lower bank 1618. Additionally the cross-reference register Row_L 1608 changes its contents to reflect the row address that cross references to this faulty memory cell that has been replaced by a redundant column. The cross-reference register changes its content to read row address 3 1628.

The BIRA algorithm continues with its backwards march through the addresses. In row address 2 1626, the BIRA algorithm detects no errors in the upper bank 1620. However, the BIRA engine detects an error in row address 2 1626 and column address 5 of the lower bank 1618. The BIRA engine references the BIRA registers and detects that this defect occurs in the fifth column. Thus, the second redundant row already substitutes for this defective component. The BIRA algorithm then may proceed with its backwards march of the next row of addresses.

Figure 24:
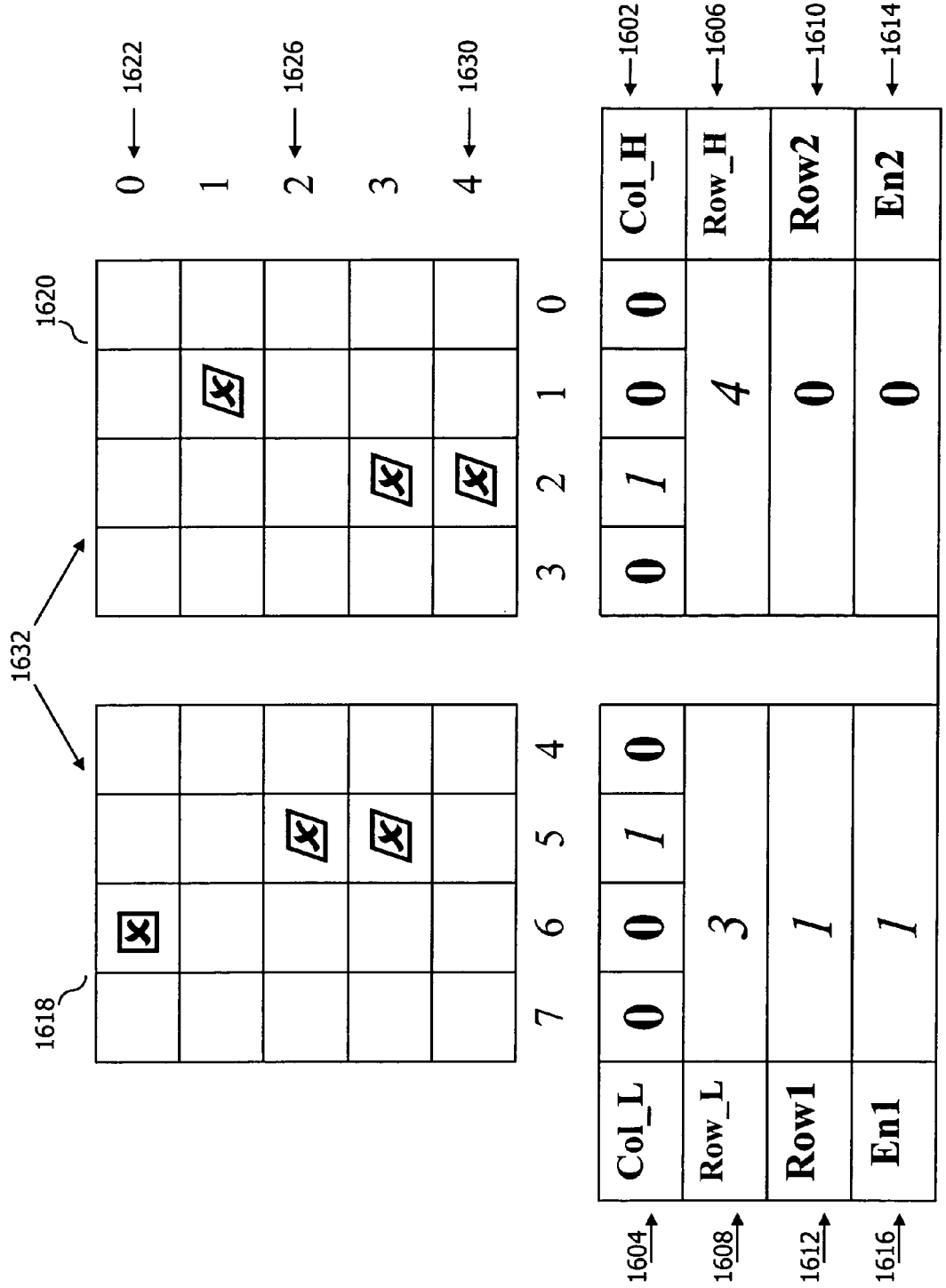

Referring to FIG. 24, the BIRA algorithm detects a defect in row address 1 1624 in the first column contained within the upper bank 1620. The BIRA algorithm according to the second logical step first tries to assign a redundant column to repair this single defect in a word, however, the BIRA engine determines that both the first redundant column and second redundant column are unavailable to be assigned as substitutes. Therefore, according to the second logical step, the BIRA engine assigns the first redundant row to substitute for the defective component containing this faulty memory cell. The BIRA registers reflect this assignment of this first redundant row. Accordingly, row register Row1 1612 changes the content of its register to a logical 1 to represent the row address of the component containing the defect that it is substituting. Status bit register En1 1616 changes the content of its registers to a logical 1 to indicate that the first redundant row is no longer available to be assigned as a substitute component.

The BIRA algorithm continues its backward march through the memory array 1632 and detects no faults in the second word contained in the lower bank 1618. Also, the BIRA algorithm detects no faults in the top word contained in the upper bank 1620.

Figure 25:
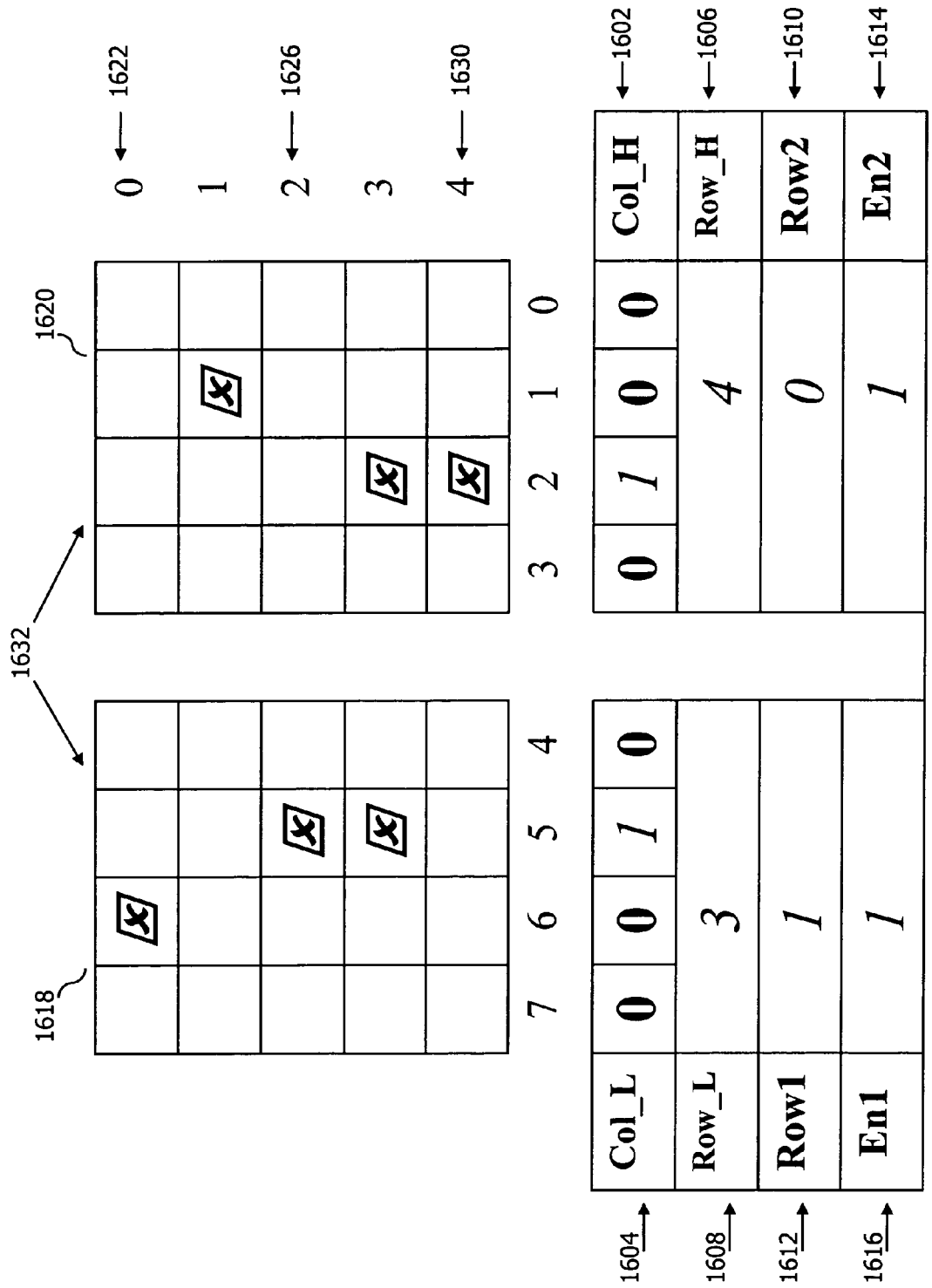

Referring to FIG. 25, the BIRA algorithm detects a fault in column address 6 and row address 0 1622 of the lower bank 1618. According to the second logical step, the BIRA algorithm checks and sees that there are no redundant columns available and thus assigns a redundant row to replace a this single defect that it discovered in the first word line in the lower bank 1618. The BIRA registers reflect this assignment of the second redundant row. The row register Row2 1610 changes the content in its register to reflect the address of the defective component, in this case the defective row, row address 0 1622. The status bit register En2 1614 changes the content in its register to reflect logical 1 to indicate that the second redundant row is no longer available to be assigned as a substitute component.

The BIRA algorithm reaches the lowest address in the memory array 1632 and proceeds to the fourth logical step. Upon proceeding to the fourth logical step, the BIRA algorithm determines that this memory is repaired because all the defects have been substituted for by redundant components. The BIRA algorithm then changes the state of decision for the redundant components to locked in and sends the repair information onto the reconfiguration data engine.

Figure 26:
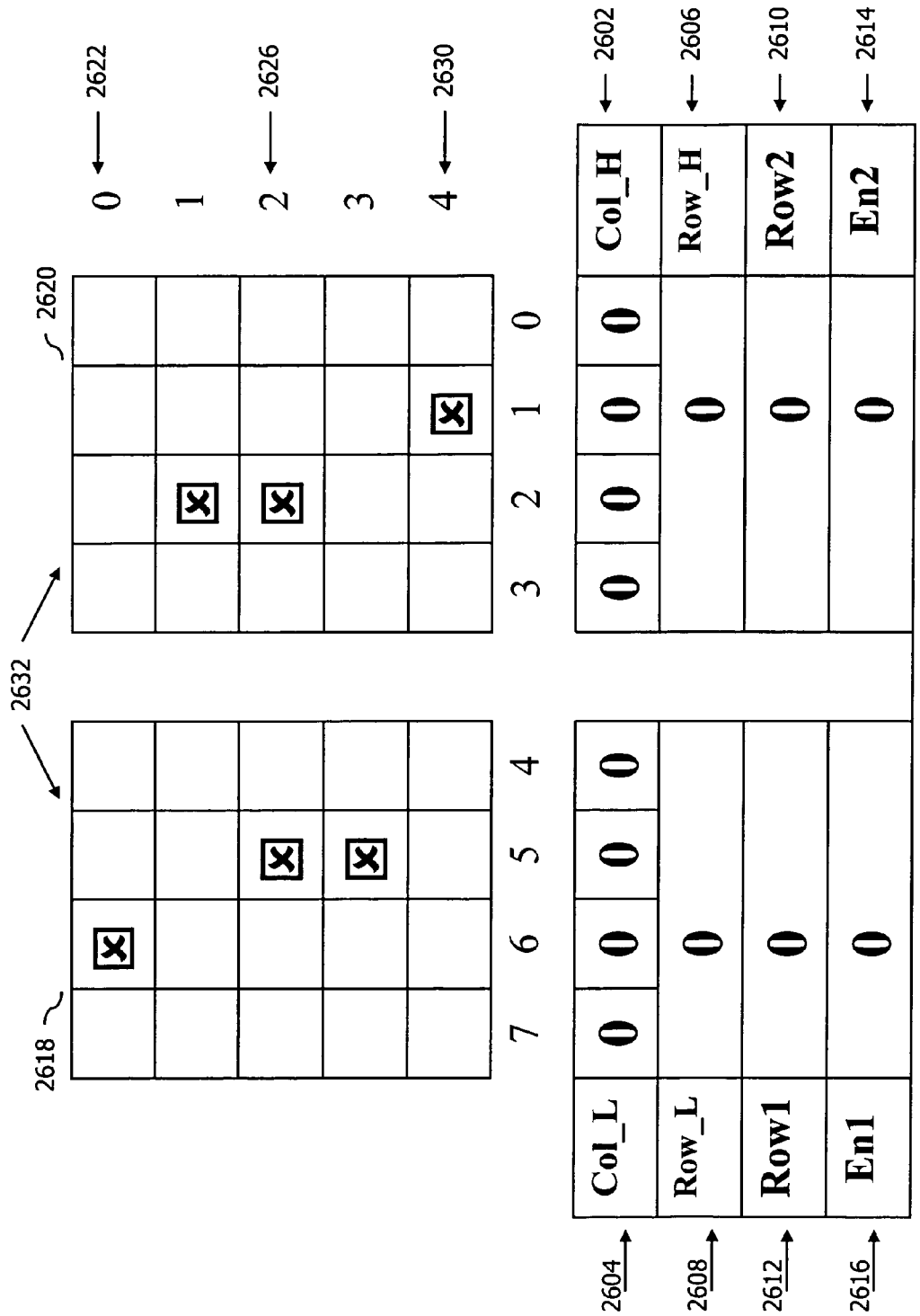
FIG. 26 through FIG. 30 illustrate an exemplary use of an embodiment of the first BIRA algorithm using a third pass through a memory array in order to allocate redundant components to repair the memory array.

FIG. 26 through FIG. 30 illustrate an exemplary use of an embodiment of the first BIRA algorithm using a third pass through a memory array in order to allocate redundant components to repair the memory array. Referring to FIG. 26, as illustrated six memory defects exist in this memory, three defects exist in the lower bank 2618 and three defects exist in the upper bank 2620. The three defects in the lower ban k are contained in row address 0 2622, row address 2 2626, and row address 3 2628. The three defects in the upper bank 2620 are contained in row address1 row address 2 2626, and row address 4 2630 respectively. The memory defects may be faulty memory cells, bad input output circuits coupled to the faulty memory cells, or any other defect which would cause that memory address to appear to be in operative. The exemplary fault pattern causes the BIRA algorithm to fail to repair the memory array 2632 in both the first pass and the second pass scans. So after a failure of the first pass in the forward direction and a second pass in the backward direction, the BIRA algorithm changes to perform the third pass upon this memory array 2632.

The third pass sequentially marches through the memory array 2632 addresses from lowest to highest, however the second logical step is altered to replace the very first single memory fault encountered with a redundant row rather than with a redundant column. Thus, FIG. 26 illustrates the starting condition of the BIRA algorithm and the BIRA registers after being reset at the completion of the unsuccessful second pass. The BIRA registers including the column register the cross-reference register the row register and the status bit registers are reset to a condition of a logical 0.

Figure 27:
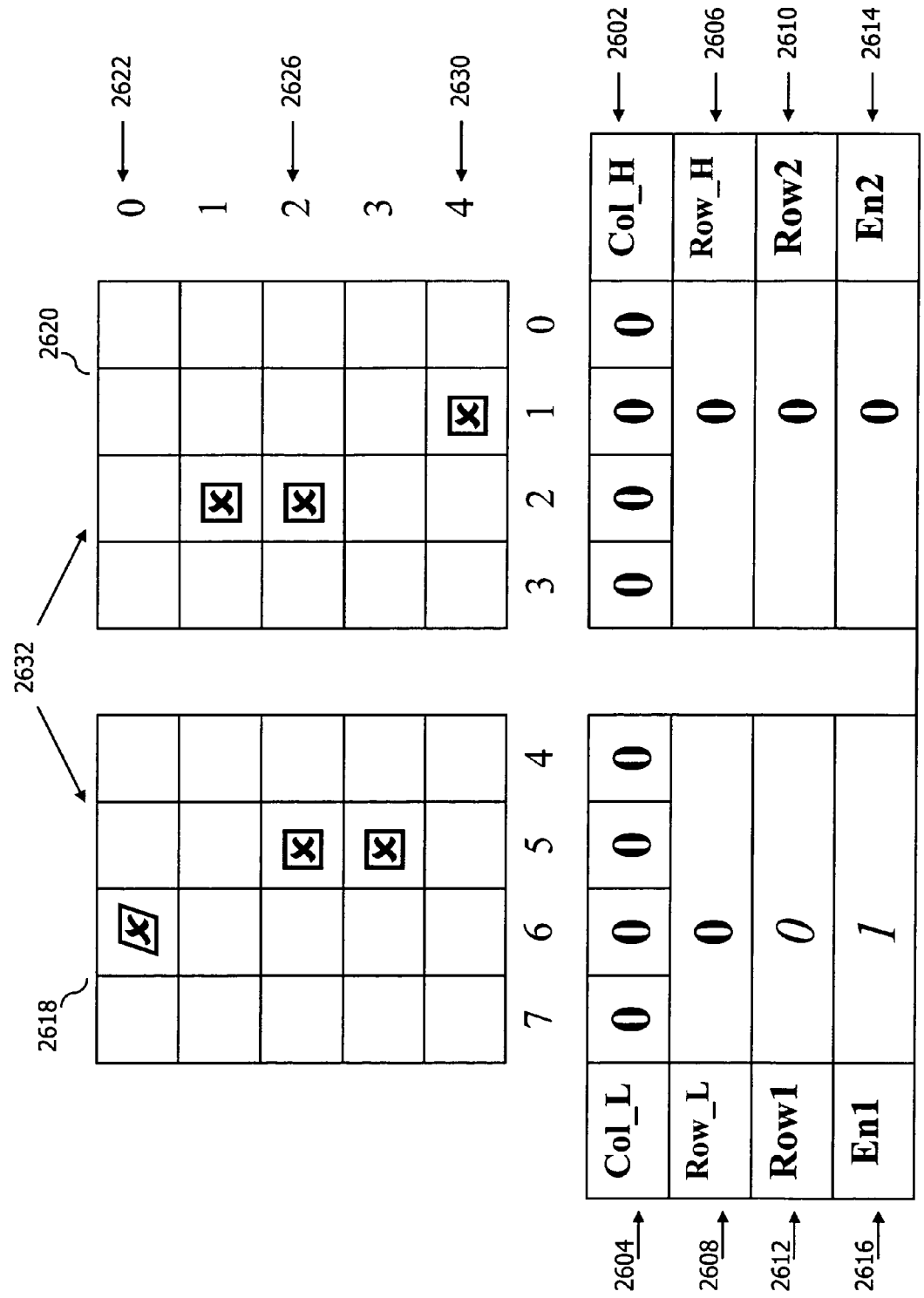

Referring to FIG. 27, the BIRA engine commences the BIRA algorithm by analyzing row address 0 2622 and detects a faulty memory cell in the first word line in the lower bank 2618 at column address 6. Upon detecting the single fault, the BIRA algorithm then replaces the single fault with a redundant row vice a redundant column. The BIRA engine assigns the first redundant row to substitute for the defective component. The BIRA registers reflect this assignment. The column register Row1 2612 changes its content to the row address that corresponds to the faulty memory cell and thus contains row address 0 2622. The status bit register En1 2616 changes its contents to reflect a logical 1 to indicate that the first redundant row is no longer available to be substituted for a defective component.

Figure 28:
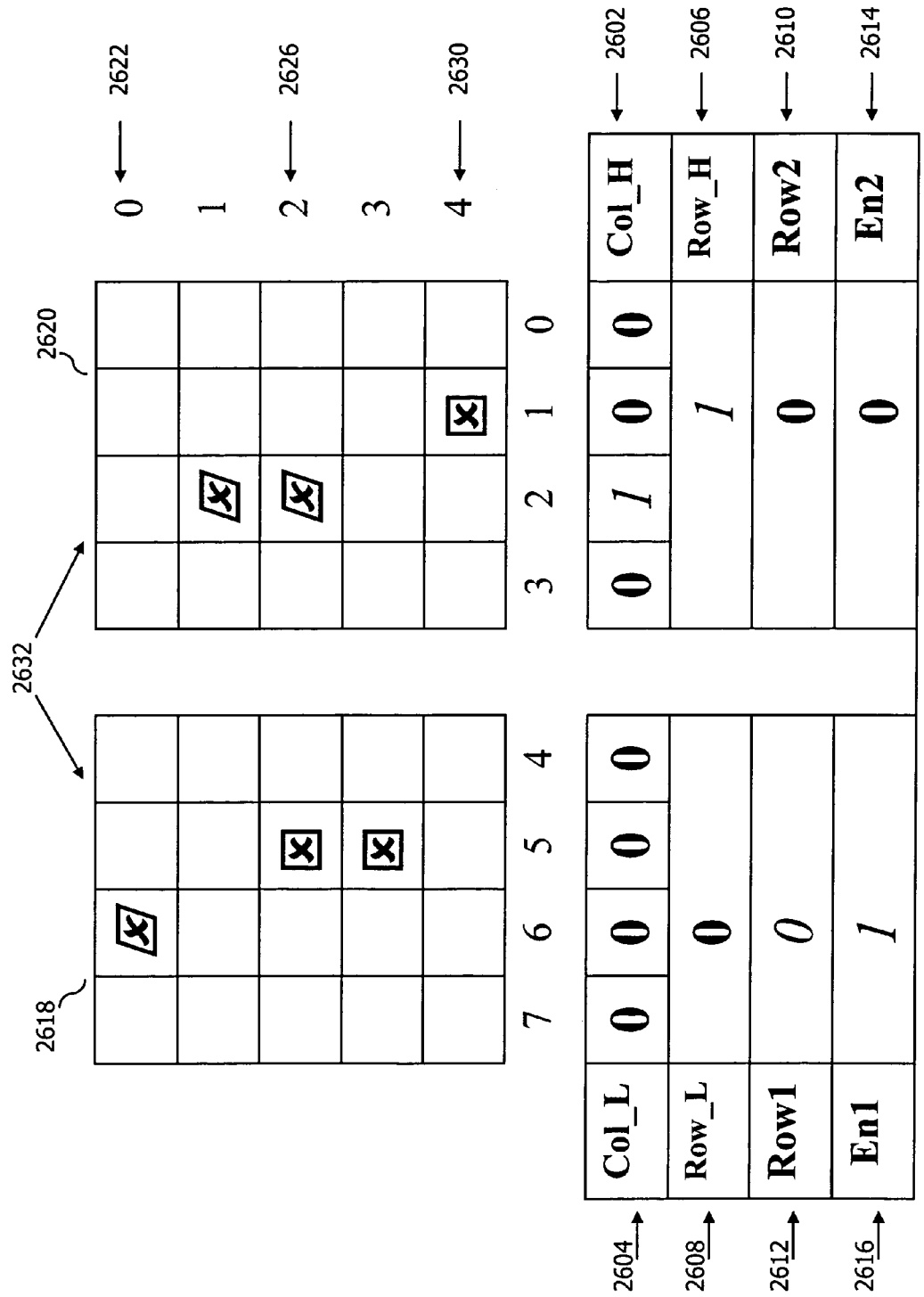

Referring to FIG. 28, the BIRA algorithm continues marching though the memory array 2632 and detects no errors in the first word line in the upper bank 2620 at row address 0 2622. The BIRA algorithm then checks row address 1 2624 of the lower bank 2618 and detects no errors. The BIRA algorithm then detects a single fault in the second word line in the upper bank 2620 contained within row address 1 2624. The BIRA algorithm, in accordance with the second logical step, replaces the single fault failure in that word with a redundant column.

The BIRA registers reflect this assignment of a redundant column to replace the faulty memory cell. Column register Col_H 2602 changes its content in the bit position corresponding to column address 2 to reflect that the first redundant column has been assigned to substitute for column 2 in the upper bank 2620. The cross reference register Row_H 2606 also changes the contents to a logical 1 to indicate that the faulty memory cell now substituted by the first redundant column cross references to row address 1 2624. Thus, cross-reference register Row_H 2606 stores a logical 1.

Figure 29:
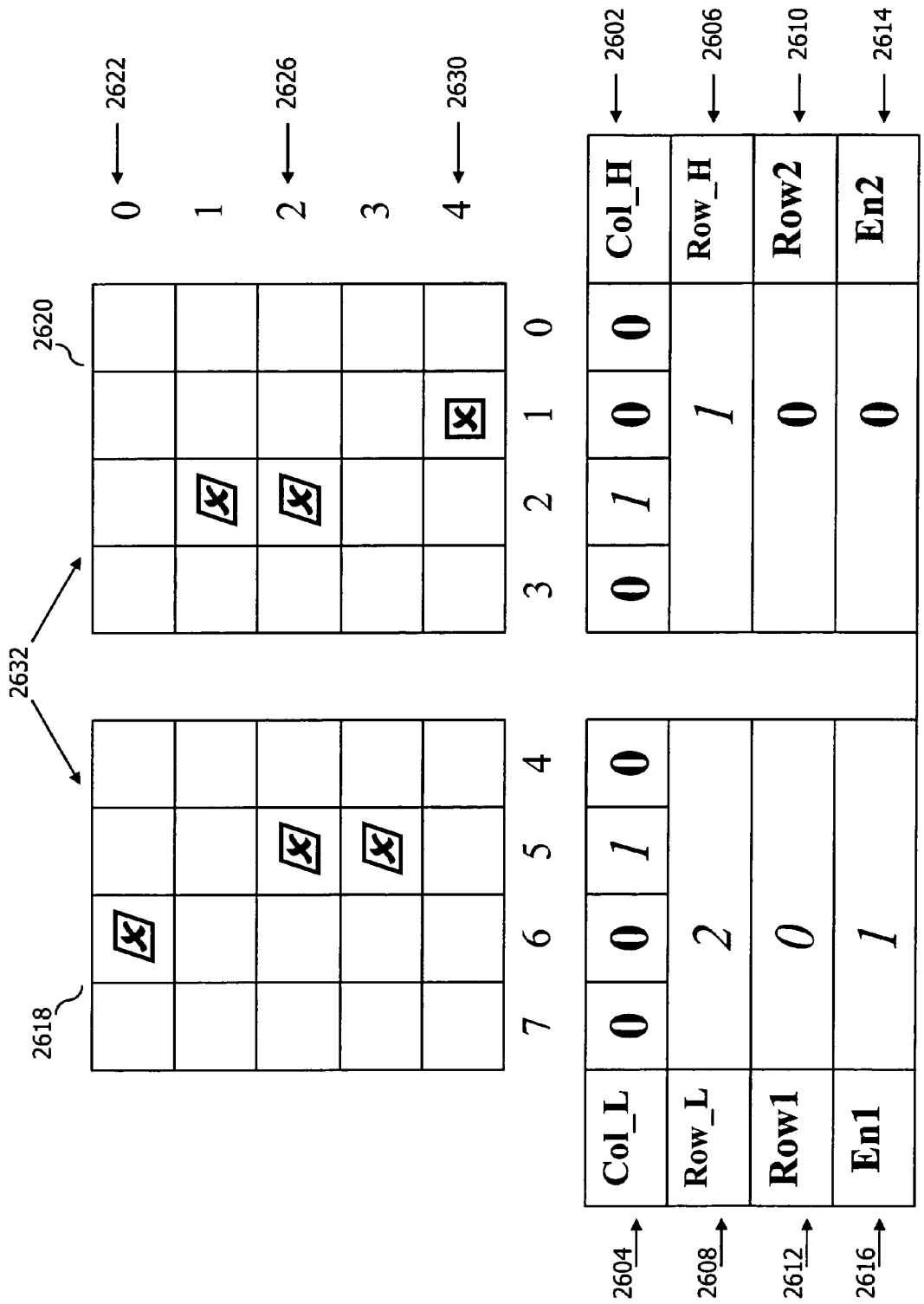

Referring to FIG. 29, the BIRA algorithm continues to sequentially march through the addresses of the memory array 2632 and detects the next defect in the third word line contained within the lower bank 2618. Column address 5 contains the faulty memory cell. Upon detecting a single fault failure in the word line, the BIRA algorithm, in accordance with the second logical step, replaces a single fault failure with a second redundant column. The BIRA registers reflect this assignment of the second redundant column. The column register Col_L 2604 changes the content of its register corresponding to column address 5 to a logical 1. The cross-reference register Row_L 2608 changes its contents to reflect the row address that cross references to the second redundant column. Thus the cross-reference register in this case changes its contents to row address 2.

The BIRA algorithm then continues to march on and finds a defect in the third word line contained in the upper bank 2620 at column address 2. The BIRA algorithm references the BIRA registers and detects that the first redundant column substituting for the second column in the upper bank 2620 already covers this faulty memory cell.

The BIRA algorithm continues to march forward through the memory addresses in the memory array 2632. The BIRA algorithm detects a faulty memory cell in row address 3 2628 of the lower bank 2618. The faulty memory cell is also located in column address 5. The BIRA algorithm references the BIRA registers and detects that the faulty memory cell in column address 5 in the lower bank 2618 is already covered by substitution of the second redundant column. Column register Col_L 2604 contains column address 5. Thus, the BIRA algorithm continues to march through the memory addresses and detects no further errors in row address 3 2628.

Figure 30:
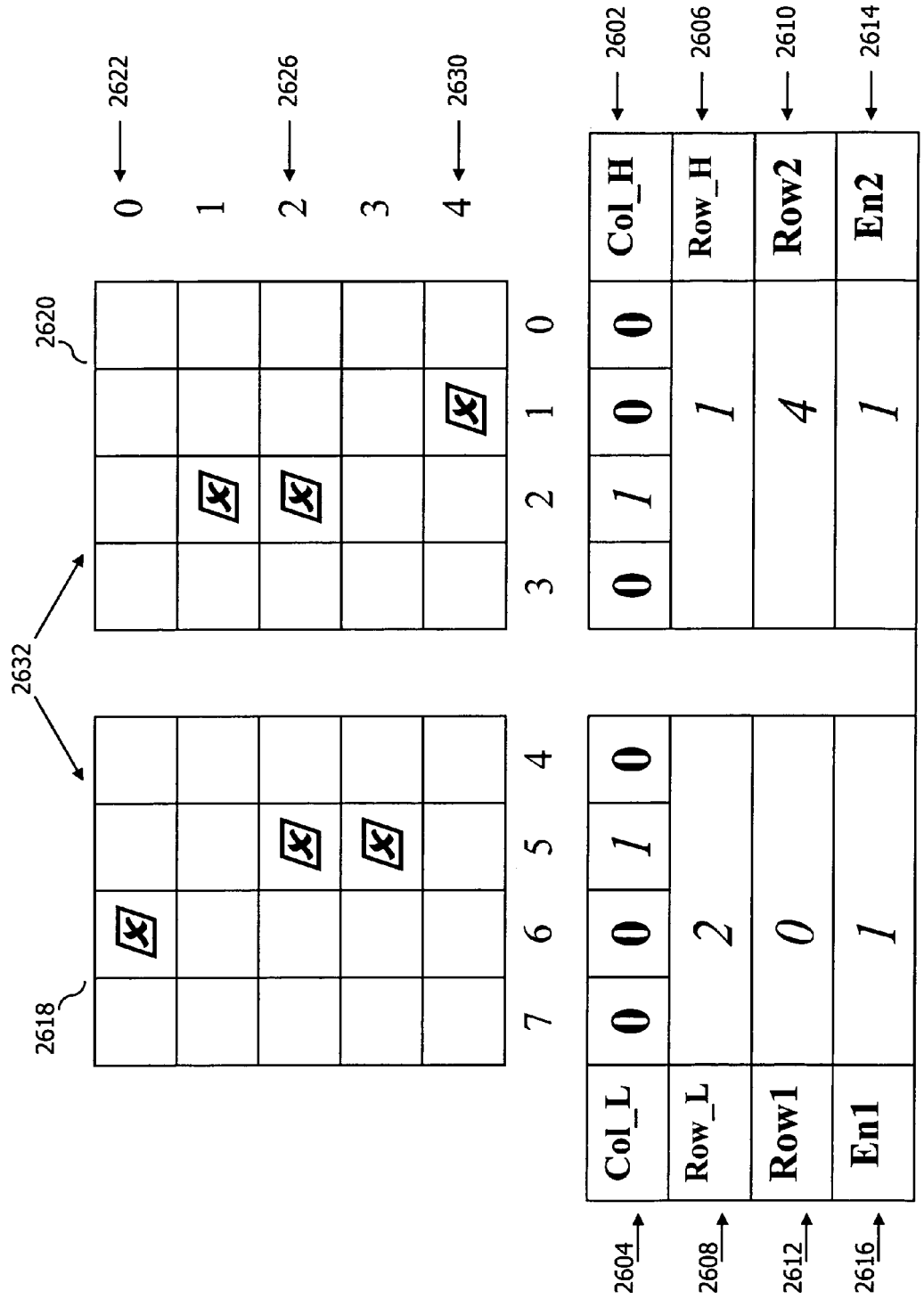

Referring to FIG. 30, the BIRA algorithm continues the forward march through the memory addresses starting at column address 4 and detects no errors in the fifth word line contained within the lower bank 2618. The BIRA algorithm then detects a fault in the fifth word line contained in the upper bank 2620. The faulty memory cell exists in the row address 4 2630 and also in column address 1. The BIRA registers and finds that this faulty cell is not covered by any redundant component at this point.

Being a single fault failure within a single word, the BIRA engine, in accordance with the second logical step, checks to see if any redundant rows are available to substitute for the defective component containing this faulty memory cell. The status bits for the redundant columns (not shown) indicate that the first redundant column and the second redundant column are unavailable to be assigned as substitute components.

The BIRA algorithm then checks to see if any redundant rows are available to be assigned as a substitute component to replace the component containing this faulty memory cell. The BIRA engine detects that after referencing the BIRA registers that the second redundant row is available to be assigned as a substitute component. The BIRA engine then assigns the second redundant row to replace this faulty memory cell found in the row address 4 2630. The BIRA engine reflects this assignment. Row register Row2 2610 changes its content within its register to indicate row address 4 2630. The status bit register En2 2614 changes its contents to a logical 1 to indicate that the second redundant row is no longer available to be used as a substitute component.

The BIRA algorithm eventually reaches the highest address in the memory array 2632 and determines that no further faults exist. The BIRA algorithm proceeds to the fourth logical step. The BIRA algorithm has covered all of the existing defects in the memory array 2632 with redundant components and determines that the memory is repaired. The BIRA engine then changes the state of decision for the redundant components stored in the BIRA registers to a locked in state of decision and sends the repair information and fault information to the reconfiguration data engine.

If the BIRA engine had not successfully repaired this memory array 2632 then the BIRA engine would have reset the BIRA registers and preceded with the fourth pass thorough this memory array 2632 in an attempt to repair this memory array 2632. This allocation of redundant components to repair faults found in the memory can occur at power up or start up. In an embodiment, each time this redundancy allocation can differ and change in the field as different defects occur to the memory array 2632.

The sequence of operations for the algorithm may be stored in a machine-readable medium. A machine-readable medium includes any mechanism that provides (i.e., stores and/or transmits) information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.).

While some specific embodiments of the invention have been shown the invention is not to be limited to these embodiments. For example, most functions performed by electronic hardware components may be duplicated by software emulation. Thus, a software program written to accomplish those same functions may emulate the functionality of the hardware components in input-output circuitry. The application specific processor may be a finite state machine. The BIRA algorithm may make one or more passes through the memory array and alter how redundant components are assigned. The invention is to be understood as not limited by the specific embodiments described herein, but only by scope of the appended claims.

What is claimed is:

1. An apparatus, comprising:
a first set of two or more memory arrays, each memory having one or more redundant components associated with that memory array, the one or more redundant components include at least one redundant column, the first set of two or more memory arrays are located on a single chip; and
a first processor located on the single chip, the first processor containing redundancy allocation logic having a repair algorithm, the repair algorithm to determine and optimize the allocation of the one or more redundant components to repair one or more defects detected in the first set of two or more memory arrays while fault testing the two or more memory arrays, wherein the first processor couples to the first set of two or more memory arrays and the repair algorithm to make multiple passes through a first memory array under analysis until a successful repair of the first memory array is achieved, where each pass implements a repair sequence having at least one of 1) a different order of assigning repair components compared to a previous pass and 2) a different memory address order compared to the previous pass in analyzing the first memory array to repair the first memory array.

2. The apparatus of claim 1, wherein the repair algorithm analyzes memory address locations of a first memory array and allocates available redundant components to substitute for non-redundant components associated with a defect based upon the following rules;

if at least two faulty cell addresses are encountered in a word in the first memory array, then a redundant row substitutes for the non-redundant component associated with a defect;

if the redundant row is not available to substitute, then the first memory array is considered unrepairable;

if a single faulty cell address is encountered in the word, then, if available, a redundant column substitutes for the non-redundant component associated with the defect;

if no redundant column is available but a redundant row is available, then a redundant row substitutes for the non-redundant components associated with the defect; and if a testing pattern of the algorithm disposes through redundant component substitution of all of the defective components associated with the first memory, then the first memory is considered repaired.

3. The apparatus of claim 2, wherein the repair algorithm further comprises two or more testing patterns that apply the rules, a first testing pattern to sequentially analyze the memory address locations of the memory array from the lowest memory address in the memory array to the highest memory address of the memory array in a first pass through the memory array, and a second testing pattern to sequentially analyze the memory address locations of the memory array from the highest memory address in the memory array to the lowest memory address of the memory array in a second pass through the memory array.

4. The apparatus of claim 1, wherein the first processor further comprises built in self-test logic, built-in self-diagnosis logic, and reconfiguration data logic.

5. The apparatus of claim 1, wherein the first processor to test each memory for defects, to allocate redundant components to substitute for the non-redundant components connected with the defects, and to perform repairs on each memory if defects exist in that memory.

6. The apparatus of claim 5, wherein the performs repairs comprises substituting redundant components for the non-redundant components connected with the defects and programming one or more fuses contained in a fuse box.

7. The apparatus of claim 1, wherein the first processor programs one or more fuses contained in a fuse box with repair information.

8. The apparatus of claim 1, wherein the first processor programs the repair information into one or more registers located in each memory without programming any fuses.

9. The apparatus of claim 1, wherein the first processor to test each memory at approximately normal operating speed.

10. The apparatus of claim 1, wherein the first processor to test and to repair each memory every time the first processor powers up or is reset.

11. The apparatus of claim 1, wherein the redundancy allocation logic further comprises:

one or more registers that identify and store the address of a redundant column substituting for a non-redundant component associated with a defect; and one or more status indicators to indicate the availability of the redundant column.

12. The apparatus of claim 1, wherein the redundancy allocation logic further comprises:

one or more registers that identify and store the address of a redundant row substituting for a non-redundant component associated with a defect;

one or more status indicators to indicate the availability of the redundant row, one or more status indicators to indicate a state of decision for the redundant row; and one or more cross-reference registers to correlate a first address of a redundant column assigned to replace the non-redundant component associated with a defect with a second address of the row that corresponds with the non-redundant component associated with the defect.

13. The apparatus of claim 12, wherein the state of decision is selected from one in a group consisting of not set, tentatively set, and locked in.

14. The apparatus of claim 1, wherein an IEEE 1149.1 interface is located on the single chip, the IEEE 1149.1 interface to transfer signals between components external to the single chip and components located on the single chip.

15. The apparatus of claim 1, wherein optimizing comprises tentatively assigning a redundant component to substitute for a non-redundant component associated with a defect and locking in the state of decision for that redundant component upon successful repair of the first memory array.

16. The apparatus of claim 15, wherein optimizing further comprises releasing the tentatively assigned redundant component from substituting for the non-redundant component if one or more conditions exist.

17. The apparatus of claim 1, wherein while still fault testing comprises approximately simultaneously testing the first memory array, allocating redundant components, and optimizing the allocation of the redundant components.

18. The apparatus of claim 1, further comprising:

a second set of two or more memory arrays, each memory array having one or more redundant components associated with that memory, the one or more redundant components include at least one redundant column, the second set of two or more memory arrays are located on a single chip:

a second processor located on a single chip, the second processor containing redundancy allocation logic having an algorithm, the algorithm to determine and optimize the allocation of the one or more redundant components to repair one or more defect detected in the second set of two or more memory arrays while fault testing the memory arrays, wherein the second processor couples to the second set of two or more memory arrays.

19. A method, comprising:

detecting defective memory locations in a first set of two or more embedded memory arrays;

allocating redundant components to repair the defective memory locations while fault testing the first set of two or more embedded memory arrays;

optimizing allocation of the redundant components;

performing multiple passes through a first memory array under analysis until a successful repair of the first memory array is achieved, where each pass implements a repair sequence having at least one of 1) a different order of assigning repair components compared to a previous pass and 2) a different memory address order compared to the previous pass in analyzing the first memory array to repair the first memory array; and performing the detecting and the allocating every time a first processor located on the same chip as the first set of two or more embedded memory arrays is powered up or reset.

20. The method of claim 19, wherein allocating redundant components is based upon the following rules;

if at least two faulty cells are encountered in a word in the first set of two or more embedded memory arrays, then a redundant row substitutes for the non-redundant component associated with a defect;

if the redundant row is not available to substitute, then the first set of two or more embedded memory arrays is considered unrepairable;

if a single faulty cell is encountered in the word, then, if available, a redundant column substitutes for the non-redundant component associated with the defect;

if no redundant column is available but a redundant row is available, then a redundant row substitutes for the non-redundant components associated with the defect; and if a testing pattern of the algorithm disposes of all of the defective components associated with the first set of two or more embedded memory arrays through redundant component substitution, then the first set of two or more embedded memory arrays is considered repaired.

21. The method of claim 19, further comprising:

substituting redundant components for the non-redundant components connected with the defects; and programming one or more fuses contained in a fuse box with the first processor.

22. The method of claim 19, further comprising:

programming the repair information into one or more registers located in each memory without programming any fuses.

23. The method of claim 19, further comprising:

testing each memory at approximately normal operating speed.

24. The method of claim 19, wherein allocating redundant components is based upon the following rules;

using a first testing pattern to sequentially analyze the memory address locations of the first set of two or more memory arrays from the lowest memory address in the first set of two or more memory arrays to the highest memory address of the first set of two or more memory arrays in a first pass through the first memory array, and using a second testing pattern to sequentially analyze the memory address locations of the first set of two or more memory arrays from the highest memory address in the first set of two or more memory arrays to the lowest memory address of the first set of two or more memory arrays in a second pass through the first memory array.

25. The method of claim 19, further comprising:

detecting defective memory locations in a second set of two or more embedded memory arrays;

allocating redundant components to repair the defective memory locations while fault testing the second set of two or more memory arrays;

optimizing allocation of the redundant components; and performing the detecting and the allocating every time a second processor located on the same chip as the second set of two or more embedded memory arrays is powered up or reset.

26. A method, comprising:

testing each of a first set of two or more embedded memory arrays on a chip for defects;

allocating redundant components to substitute for the non-redundant components connected with the defects with a first processor;

performing repairs on each embedded memory array if defects exist in that embedded memory array with the first processor;

programming the repair information with the first processor into one or more registers located in each memory array without programming any non-volatile fuses;

performing multiple passes through a first memory array under analysis until a successful repair of the first memory array is achieved, where each pass implements a repair sequence having at least one of 1) a different order of assigning repair components compared to a previous pass and 2) a different memory address order compared to the previous pass in analyzing the first memory array to repair the first memory array; and performing the repairs on the embedded memory array without communicating the testing for defects results to a component external to the chip.

27. The method of claim 26, wherein allocating redundant components is based upon the following rules;

if at least two faulty cells are encountered in a word in the memory array, then a redundant row substitutes for the non-redundant component associated with a defect;

if the redundant row is not available to substitute, then the memory array is considered unrepairable;

if a single faulty cell is encountered in the word, then, if available, a redundant column substitutes for the non-redundant component associated with the defect;

if no redundant column is available but a redundant row is available, then a redundant row substitutes for the non-redundant components associated with the defect; and if a testing pattern of the algorithm disposes of all of the defective components associated with the memory through redundant component substitution, then the memory is considered repaired.

28. The method of claim 27, further comprising:

changing the status of the redundant column from unavailable to available based upon certain conditions.

29. An apparatus, comprising:

means for detecting defective memory locations in a first embedded memory array;

means for allocating redundant components to repair the defective memory locations prior to the failure results being exported to a component external to the single chip;

means for performing multiple passes through the first memory array under analysis until a successful repair of the first memory array is achieved, where each pass implements a repair sequence having at least one of 1) a different order of assigning repair components compared to a previous pass and 2) a different memory address order compared to the previous pass in analyzing the first memory array to repair the first memory array; and means for performing the detecting and the allocating every time a first processor located on the same chip as the first set of two or more embedded memory array is powered up or reset.

30. The apparatus of claim 29, further comprising:

means for substituting redundant components for the non-redundant components connected with the defects; and means for programming one or more fuses contained in a fuse box with the first processor.

31. The apparatus of claim 29, further comprising:

means for testing each memory at approximately normal operating speed.

32. A machine-readable medium that stores instructions, which when executed by a machine, cause the machine to perform operations comprising:

testing a first embedded memory array on a chip for defects;

allocating redundant components to substitute for the non-redundant components connected with the defects;

performing repairs on the first embedded memory array if defects exist in that embedded memory;

programming the repair information into one or more registers located in the first memory array without programming any non-volatile fuses;

performing multiple passes through the first memory array under analysis until a successful repair is achieved, where each pass implements a repair sequence having at least one of 1) a different order of assigning repair components and 2) a different memory address order in analyzing the first memory to repair the first memory; and performing the repairs on the first embedded memory arrays without communicating the testing for defects results to a component external to the chip.

33. The article of manufacture of claim 32, which causes the machine to perform the further operations comprising:

testing each memory at approximately normal operating speed.

34. An apparatus, comprising:

one or more memory arrays, each memory array having one or more redundant components associated with that memory, the one or more redundant components include at least one redundant column, the one or more memory arrays are located on a single chip; and a first processor located on the single chip, the first processor containing redundancy allocation logic having a repair algorithm, the repair algorithm to determine the allocation of the one or more redundant components to repair two or more defects detected in the two or more memory arrays prior to the failure results being exported to a component external to the single chip, the first processor to program the repair information into one or more registers located in each memory array without programming any fuses, wherein the first processor couples to the one or more memory arrays and the repair algorithm to make multiple passes through a first memory array under analysis until a successful repair is achieved, where each pass implements a repair sequence having at least one of 1) a different order of assigning repair components and 2) a different memory address order in analyzing the first memory to repair the first memory.

35. The apparatus of claim 34, further comprising:

a second set of two or more memory arrays, each memory array having one or more redundant components associated with that memory, the one or more redundant components include at least one redundant column, the second set of two or more memory arrays are located on a single chip; and a second processor located on the single chip, the second processor containing redundancy allocation logic having an algorithm, the algorithm to determine the allocation of the one or more redundant components to repair one or more defects detected in the second set of two or more memory arrays prior to the failure results being exported to a component external to the single chip, the second processor to program the repair information into one or more registers located in each memory array without programming any fuses, wherein the second processor couples to the second set of two or more memory arrays.

* * * * *